(12) United States Patent
Fukushima et al.

(10) Patent No.: US 9,348,227 B2
(45) Date of Patent: May 24, 2016

(54) CHEMICALLY AMPLIFIED RESIST COMPOSITION AND PATTERN FORMING PROCESS

(71) Applicant: Shin-Etsu Chemical Co., Ltd., Tokyo (JP)

(72) Inventors: Masahiro Fukushima, Joetsu (JP); Daisuke Domon, Joetsu (JP); Keiichi Masunaga, Joetsu (JP); Satoshi Watanabe, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/733,170

(22) Filed: Jun. 8, 2015

(65) Prior Publication Data
US 2015/0355544 A1 Dec. 10, 2015

(30) Foreign Application Priority Data

Jun. 9, 2014 (JP) .................................. 2014-118577

(51) Int. Cl.
*G03F 7/039* (2006.01)
*G03F 7/004* (2006.01)
*G03F 7/20* (2006.01)
*G03F 7/30* (2006.01)
*G03F 7/32* (2006.01)
*G03F 1/76* (2012.01)
*G03F 1/78* (2012.01)

(52) U.S. Cl.
CPC ............. *G03F 7/0392* (2013.01); *G03F 1/76* (2013.01); *G03F 1/78* (2013.01); *G03F 7/0045* (2013.01); *G03F 7/0397* (2013.01); *G03F 7/2041* (2013.01); *G03F 7/30* (2013.01); *G03F 7/322* (2013.01)

(58) Field of Classification Search
None
See application file for complete search history.

(56) References Cited

U.S. PATENT DOCUMENTS

| 6,479,210 | B2 | 11/2002 | Kinoshita et al. | |
|---|---|---|---|---|
| 6,485,883 | B2 | 11/2002 | Kodama et al. | |
| 6,492,091 | B2 | 12/2002 | Kodama et al. | |
| 7,214,467 | B2 | 5/2007 | Kanna et al. | |
| 7,812,105 | B2 | 10/2010 | Nagai et al. | |
| 7,897,821 | B2 | 3/2011 | Nagai et al. | |
| 7,977,027 | B2 | 7/2011 | Takeda et al. | |
| 8,343,694 | B2 | 1/2013 | Koitabashi et al. | |
| 2002/0025489 | A1* | 2/2002 | Shimada ............... | B41C 1/1008 430/270.1 |
| 2004/0260031 | A1 | 12/2004 | Takeda et al. | |

FOREIGN PATENT DOCUMENTS

| JP | 11-327143 | A | 11/1999 |
|---|---|---|---|
| JP | 2004-115630 | A | 4/2004 |
| JP | 2005-008766 | A | 1/2005 |
| JP | 3955384 | B2 | 8/2007 |
| JP | 2008102383 | A | 5/2008 |
| JP | 4116340 | B2 | 7/2008 |
| JP | 2008-304590 | A | 12/2008 |
| JP | 4226803 | B2 | 2/2009 |
| JP | 4231622 | B2 | 3/2009 |
| WO | 2006/121096 | A1 | 11/2006 |

\* cited by examiner

*Primary Examiner* — Sin Lee
(74) *Attorney, Agent, or Firm* — Westerman, Hattori, Daniels & Adrian, LLP

(57) ABSTRACT

A resist composition is provided comprising (A) a carboxylic acid sulfonium salt whose anion moiety has a bulky structure of arenecarboxylate in which secondary or tertiary carbon atoms bond at both ortho-positions relative to the carbon atom in bond with carboxylate, as an acid diffusion regulator and (B) a polymer which is decomposed under the action of acid to increase its solubility in alkaline developer. When processed by EB or EUV lithography, the resist composition exhibits a very high resolution and forms a pattern with minimal LER.

10 Claims, No Drawings

CHEMICALLY AMPLIFIED RESIST COMPOSITION AND PATTERN FORMING PROCESS

CROSS-REFERENCE TO RELATED APPLICATION

This non-provisional application claims priority under 35 U.S.C. §119(a) on Patent Application No. 2014-118577 filed in Japan on Jun. 9, 2014, the entire contents of which are hereby incorporated by reference.

TECHNICAL FIELD

This invention relates to a chemically amplified resist composition which is sensitive to high-energy radiation such as UV, DUV, EB, EUV, X-ray, gamma-ray or synchrotron radiation, and useful in processing of semiconductors and photomask blanks, and more particularly, to a chemically amplified resist composition which is amenable to the step of exposure to a beam of high-energy radiation such as EB or DUV, and a pattern forming process using the resist composition.

BACKGROUND ART

To meet the recent demand for higher integration in integrated circuits, pattern formation to a finer feature size is required. Acid-catalyzed chemically amplified resist compositions are most often used in forming resist patterns with a feature size of 0.2 μm or less. High-energy radiation such as UV, deep-UV or electron beam (EB) is used as the light source for exposure of these resist compositions. In particular, while EB lithography is utilized as the ultra-fine microfabrication technique, it is also indispensable in processing a photomask blank to form a photomask for use in semiconductor device fabrication.

Polymers comprising a major proportion of aromatic structure having an acidic side chain, for example, polyhydroxystyrene have been widely used in resist materials for the KrF excimer laser lithography. These polymers are not used in resist materials for the ArF excimer laser lithography since they exhibit strong absorption at a wavelength of around 200 nm. These polymers, however, are expected to form useful resist materials for the EB and EUV lithography for forming patterns of finer size than the processing limit of ArF excimer laser because they offer high etching resistance.

Often used as the base polymer in positive resist compositions for EB and EUV lithography is a polymer having an acidic functional group on phenol side chain masked with an acid labile protective group. Upon exposure to high-energy radiation, the acid labile protective group is deprotected by the catalysis of an acid generated from a photoacid generator so that the polymer may turn soluble in alkaline developer. Typical of the acid labile protective group are tertiary alkyl, tert-butoxycarbonyl, and acetal groups. On use of protective groups requiring a relatively low level of activation energy for deprotection such as acetal groups, a resist film having a high sensitivity is advantageously obtainable. However, if the diffusion of generated acid is not fully controlled, deprotection reaction can occur even in the unexposed regions of the resist film, giving rise to problems like degradation of line edge roughness (LER) and a lowering of in-plane uniformity of pattern line width (CDU).

Improvements were made in the control of resist sensitivity and pattern profile by properly selecting and combining components used in resist compositions and adjusting processing conditions. One outstanding problem is the diffusion of acid that has a material impact on the resolution of a chemically amplified resist composition. Many studies are made on the acid diffusion problem because sensitivity and resolution are largely affected thereby.

An acid diffusion regulator is, in fact, essential for controlling acid diffusion and improving the performance of a resist composition. Studies have been made on the acid diffusion regulator while amines and weak acid onium salts have been generally used. The weak acid onium salts are exemplified in several patent documents. JP 3955384 describes that the addition of triphenylsulfonium acetate ensures to form a satisfactory resist pattern without T-top profile, a difference in line width between isolated and grouped patterns, and standing waves. JP-A H11-327143 reports improvements in sensitivity, resolution and exposure margin by the addition of sulfonic acid ammonium salts or carboxylic acid ammonium salts. Also, JP 4231622 describes that a resist composition for KrF or EB lithography comprising a PAG capable of generating a fluorinated carboxylic acid is improved in resolution and process latitude such as exposure margin and depth of focus. Further, JP 4116340 describes that a resist composition for $F_2$ laser lithography comprising a PAG capable of generating a fluorinated carboxylic acid is improved in line edge roughness (LER) and solves the footing problem. While these four patent documents refer to the KrF, EB and $F_2$ lithography, JP 4226803 describes a positive photosensitive composition for ArF excimer laser lithography comprising a carboxylic acid onium salt. These systems are based on the mechanism that a salt exchange occurs between a weak acid onium salt and a strong acid (sulfonic acid) generated by another PAG upon exposure, to form a weak acid and a strong acid onium salt. That is, the strong acid (sulfonic acid) having high acidity is replaced by a weak acid (carboxylic acid), thereby suppressing acid-catalyzed decomposition reaction of acid labile group and reducing or controlling the distance of acid diffusion. The onium salt apparently functions as an acid diffusion regulator.

However, when a resist composition comprising the foregoing carboxylic acid onium salt or fluorocarboxylic acid onium salt is used in patterning, a problem of LER arises. It would be desirable to have an acid diffusion regulator capable of minimizing LER.

CITATION LIST

Patent Document 1: JP 3955384 (U.S. Pat. No. 6,479,210)
Patent Document 2: JP-A H11-327143
Patent Document 3: JP 4231622 (U.S. Pat. No. 6,485,883)
Patent Document 4: JP 4116340 (U.S. Pat. No. 7,214,467)
Patent Document 5: JP 4226803 (U.S. Pat. No. 6,492,091)

DISCLOSURE OF INVENTION

An object of the invention is to provide a chemically amplified resist composition which is processed by lithography to form a resist pattern with minimal LER, and a pattern forming process using the resist composition.

The inventors have found that a resist composition comprising a sulfonium salt having the general formula (1) defined below can be processed by lithography to form a resist pattern with minimal LER.

In one aspect, the invention provides a chemically amplified resist composition comprising (A) a sulfonium salt having the general formula (1) and (B) a polymer comprising recurring units having the general formula (U-1), which is decomposed under the action of acid to increase its solubility in alkaline developer.

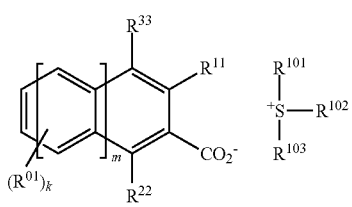
(1)

Herein $R^{11}$ and $R^{22}$ are each independently a branched or cyclic $C_3$-$C_{20}$ monovalent hydrocarbon group which may be substituted with or separated by a heteroatom, $R^{33}$ and $R^{01}$ are each independently hydrogen, or a straight $C_1$-$C_{20}$ or branched or cyclic $C_3$-$C_{20}$ monovalent hydrocarbon group which may be substituted with or separated by a heteroatom, k is an integer of 0 to 4, or $R^{11}$, $R^{22}$, $R^{33}$ and $R^{01}$ may bond together to form a ring with the carbon atoms to which they are attached and the carbon atom or atoms therebetween, m is 0 or 1, $R^{101}$, $R^{102}$ and $R^{103}$ are each independently a straight $C_1$-$C_{20}$ or branched or cyclic $C_3$-$C_{20}$ monovalent hydrocarbon group which may be substituted with or separated by a heteroatom, or any two or more of $R^{101}$, $R^{102}$ and $R^{103}$ may bond together to form a ring with the sulfur atom.

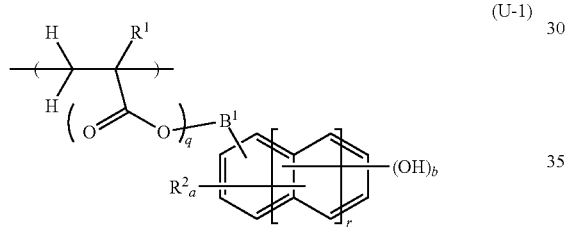
(U-1)

Herein q is 0 or 1, r is an integer of 0 to 2, $R^1$ is hydrogen, fluorine, methyl or trifluoromethyl, $R^2$ is each independently hydrogen or $C_1$-$C_6$ alkyl, $B^1$ is a single bond or $C_1$-$C_{10}$ alkylene which may contain an ether bond, a is an integer satisfying a≤5+2r−b, and b is an integer of 1 to 3.

In a preferred embodiment, component (A) is selected from the following sulfonium salts (A-30) to (A-44).

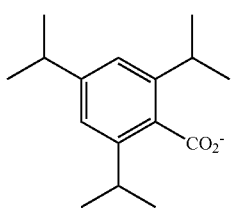
(A-30)

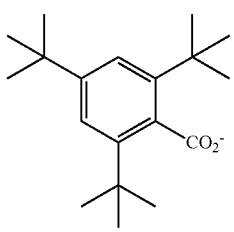
(A-31)

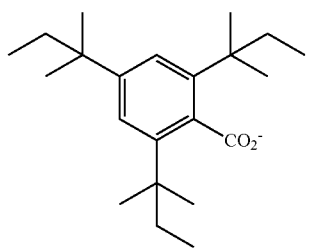
(A-32)

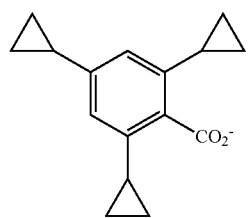
(A-33)

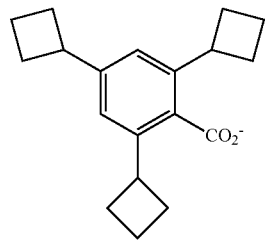
(A-34)

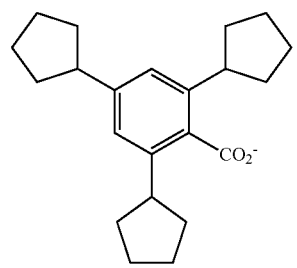
(A-35)

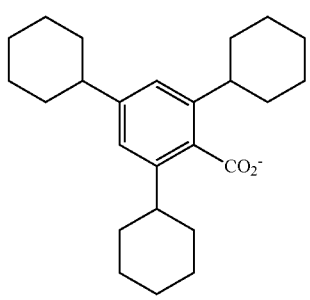
(A-36)

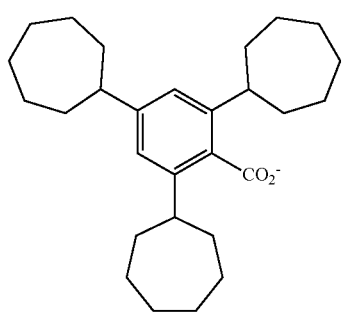
(A-37)

-continued
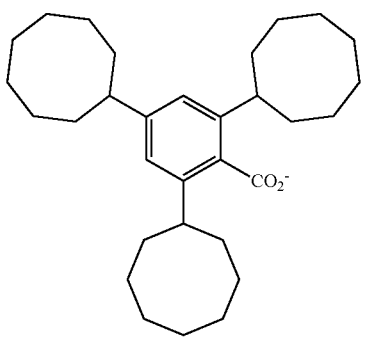
(A-38)
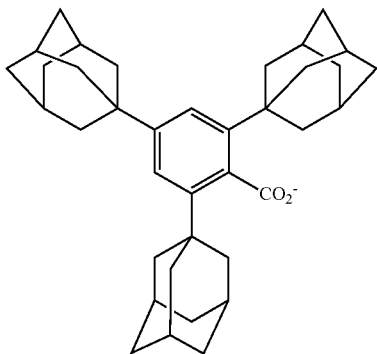
(A-42)
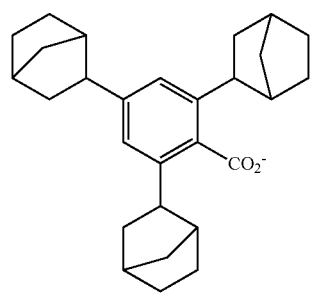
(A-39)
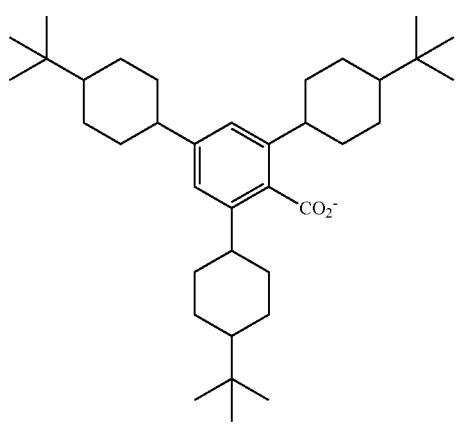
(A-43)
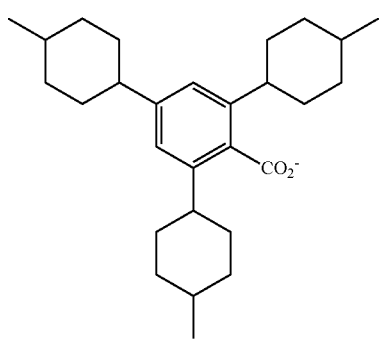
(A-40)
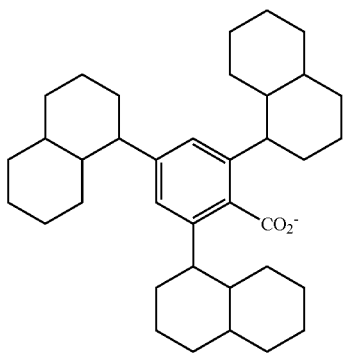
(A-44)
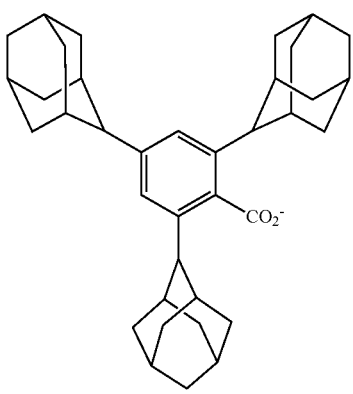
(A-41)
In a preferred embodiment, the resist composition may further comprise an acid generator capable of generating at least one acid selected from sulfonic acids, imidic acids, and methide acids, upon exposure to high-energy radiation.
In a preferred embodiment, the polymer further comprises recurring units having the general formula (U-2).
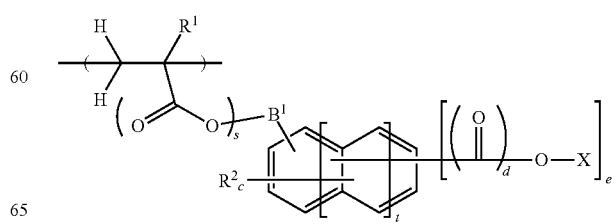
(U-2)

Herein s is 0 or 1, t is an integer of 0 to 2, $R^1$, $R^2$, and $B^1$ are as defined above, c is an integer satisfying $c \leq 5+2t-e$, d is 0 or 1, e is an integer of 1 to 3, X is an acid labile group when e is 1 or X is hydrogen or an acid labile group when e is 2 or 3, at least one X being an acid labile group.

In a preferred embodiment, the polymer further comprises recurring units having the general formula (U-3) and/or (U-4).

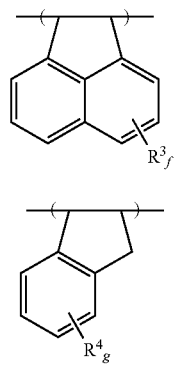

Herein f is an integer of 0 to 6, $R^3$ is each independently hydrogen, an optionally halo-substituted $C_1$-$C_6$ alkyl or primary or secondary alkoxy group, or an optionally halo-substituted $C_1$-$C_7$ alkylcarbonyloxy group, g is an integer of 0 to 4, and $R^4$ is each independently hydrogen, an optionally halo-substituted $C_1$-$C_6$ alkyl or primary or secondary alkoxy group, or an optionally halo-substituted $C_1$-$C_7$ alkylcarbonyloxy group.

In a preferred embodiment, the resist composition further comprises a basic compound.

Typically the resist composition is subject to ArF, KrF, EB, EUV or X-ray lithography.

In another aspect, the invention provides a pattern forming process comprising the steps of applying the chemically amplified resist composition defined above onto a processable substrate to form a resist film, exposing patternwise the resist film to high-energy radiation, and developing the exposed resist film in an alkaline developer to form a resist pattern.

Preferably, the processable substrate has the outermost surface of a chromium-containing material. Typically, the processable substrate is a photomask blank.

Advantageous Effects of Invention

When the inventive resist composition comprising the sulfonium salt is processed by a micropatterning process, typically EB or EUV lithography, a resist pattern having a very high resolution and minimal LER is formed.

DESCRIPTION OF EMBODIMENTS

As used herein, the singular forms "a," "an" and "the" include plural referents unless the context clearly dictates otherwise. The notation (Cn-Cm) means a group containing from n to m carbon atoms per group.

The abbreviations and acronyms have the following meaning.

EB: electron beam
DUV: deep ultraviolet
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LER: line edge roughness Briefly stated, one embodiment of the invention is a chemically amplified resist composition comprising a sulfonium salt having the general formula (1).

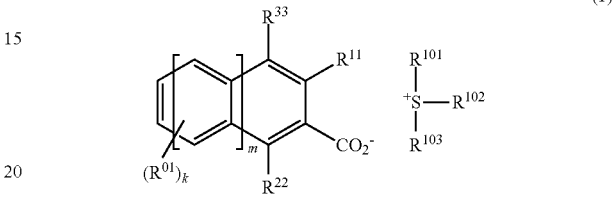

Herein $R^{11}$ and $R^{22}$ are each independently a branched or cyclic $C_3$-$C_{20}$ monovalent hydrocarbon group which may be substituted with or separated by a heteroatom. $R^{33}$ and $R^{01}$ are each independently hydrogen, or a straight $C_1$-$C_{20}$ or branched or cyclic $C_3$-$C_{20}$ monovalent hydrocarbon group which may be substituted with or separated by a heteroatom, k is an integer of 0 to 4. $R^{11}$, $R^{22}$, $R^{33}$ and $R^{01}$ may bond together to form a ring with the carbon atoms to which they are attached and if any, the carbon atom or atoms therebetween, m is 0 or 1. $R^{101}$, $R^{102}$ and $R^{103}$ are each independently a straight $C_1$-$C_{20}$ or branched or cyclic $C_3$-$C_{20}$ monovalent hydrocarbon group which may be substituted with or separated by a heteroatom, or any two or more of $R^{101}$, $R^{102}$ and $R^{103}$ may bond together to form a ring with the sulfur atom in the formula.

Suitable branched or cyclic monovalent hydrocarbon groups of $R^{11}$ and $R^{22}$ include isopropyl, sec-butyl, tert-butyl, tert-amyl, cyclopropyl, cyclobutyl, cyclopentyl, cyclohexyl, cyclooctyl, cyclopentylmethyl, cyclopentylethyl, cyclopentylbutyl, cyclohexylmethyl, cyclohexylethyl, cyclohexylbutyl, norbornyl, adamantyl, and 4-tetrahydropyranyl.

$R^{33}$ and $R^{01}$ are each independently hydrogen, or a straight $C_1$-$C_{20}$ or branched or cyclic $C_3$-$C_{20}$ monovalent hydrocarbon group which may be substituted with or separated by a heteroatom. Suitable monovalent hydrocarbon groups include methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, tricyclo[$5.2.1.0^{2,6}$]decanyl, adamantyl, and adamantylmethyl.

In the hydrocarbon groups of $R^{11}$, $R^{22}$, $R^{33}$ and $R^{01}$, a hydrogen atom (or atoms) may be substituted by a heteroatom such as oxygen, sulfur, nitrogen or halogen, or a heteroatom such as oxygen, sulfur or nitrogen may intervene. As a result, a hydroxyl, cyano, carbonyl, ether bond, ester bond, sulfonic acid ester bond, carbonate bond, lactone ring, sultone ring, carboxylic anhydride or haloalkyl group may form or intervene.

In formula (1), k indicative of the number of $R^{01}$ is an integer in the range: $0 \leq k \leq 2$ in case of $m=0$ and in the range: $0 \leq k \leq 4$ in case of $m=1$. $R^{11}$, $R^{22}$, $R^{33}$ and $R^{01}$ may bond together to form a ring with the carbon atoms to which they are attached and if any, the carbon atom or atoms therebetween. Suitable cyclic substituent groups thus formed include cyclopentyl, cyclohexyl, and norbornyl, in which a hydrogen atom (or atoms) may be substituted by a heteroatom such as oxygen, sulfur, nitrogen or halogen, or a heteroatom such as oxygen, sulfur or nitrogen may intervene. As a result, a hydroxyl, cyano, carbonyl, ether bond, ester bond, sulfonic acid ester bond, carbonate bond, lactone ring, sultone ring, carboxylic anhydride or haloalkyl group may form or intervene. In formula (1), the value of m is 0 or 1, with m=0 being preferred.

Examples of the preferred structure of the anion moiety in the sulfonium salt having formula (1) are shown below, but the sulfonium salt is not limited thereto.

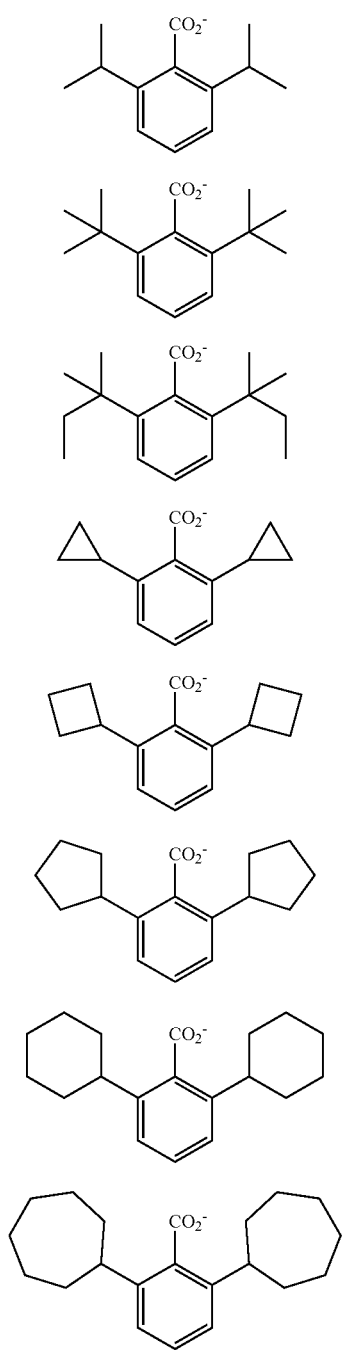

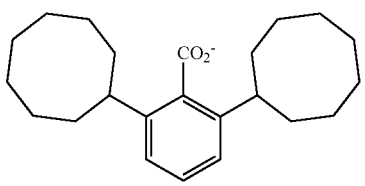

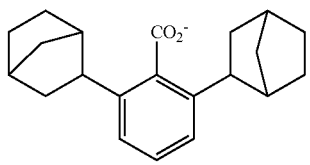

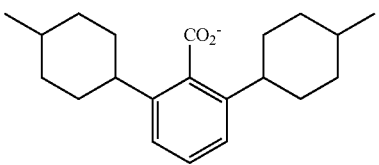

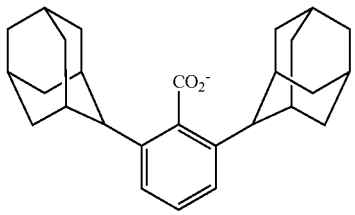

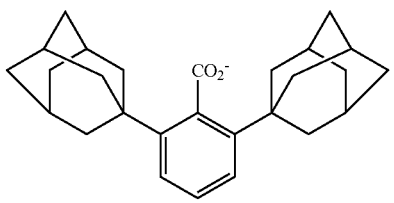

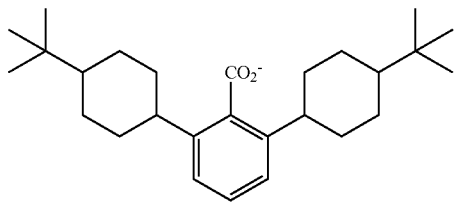

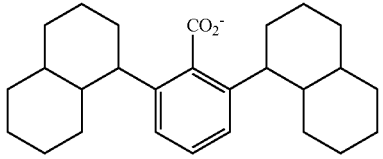

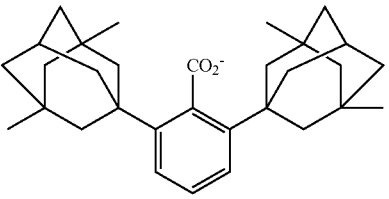

Chemical structure figures (A-17) through (A-31).

(A-32)
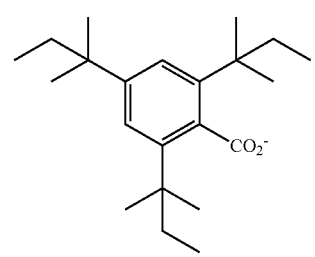
(A-33)
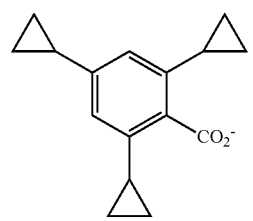
(A-34)
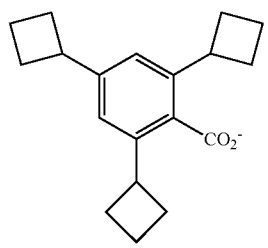
(A-35)
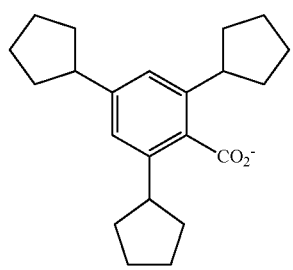
(A-36)
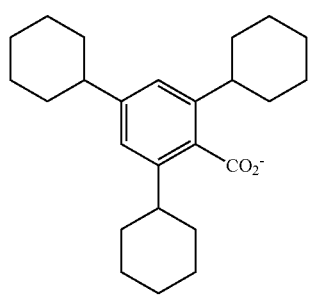
(A-37)
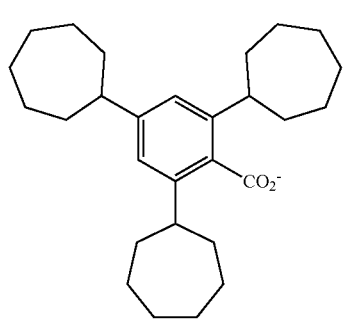
(A-38)
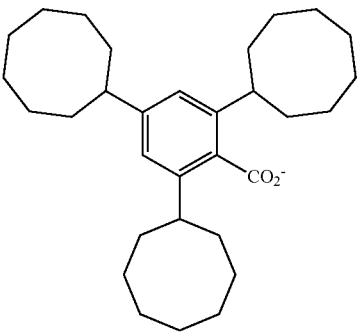
(A-39)
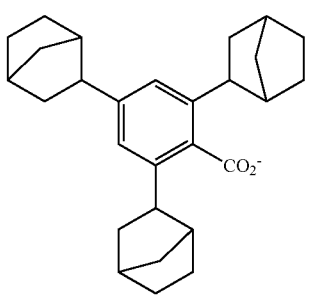
(A-40)
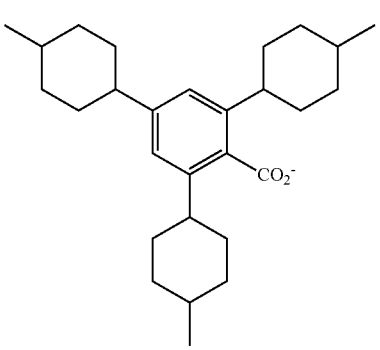
(A-41)
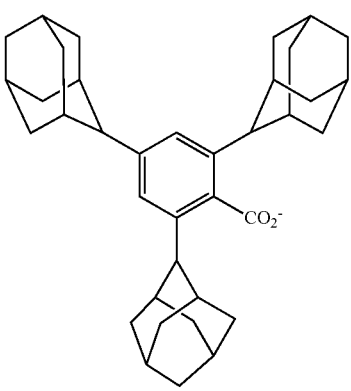

(A-42)
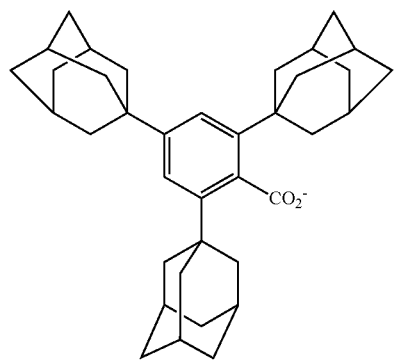
(A-43)
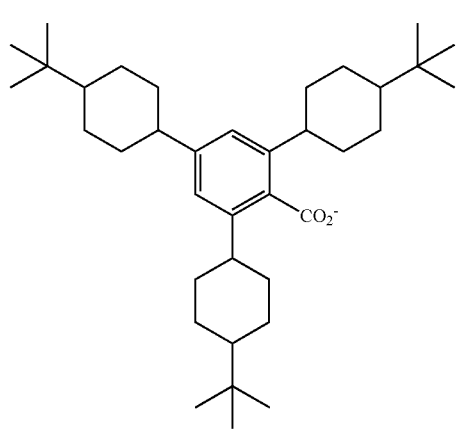
(A-44)
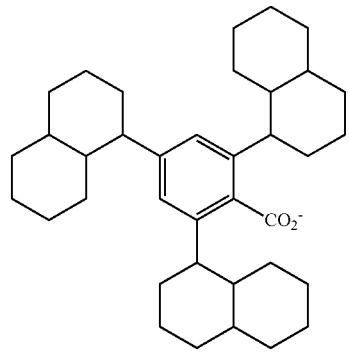
(A-45)
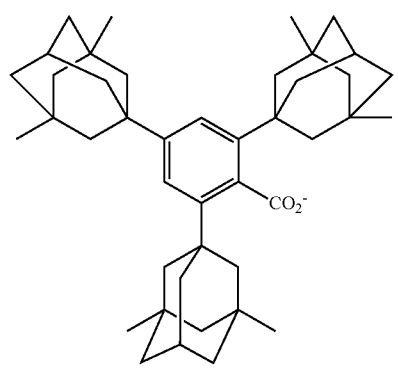
(A-46)
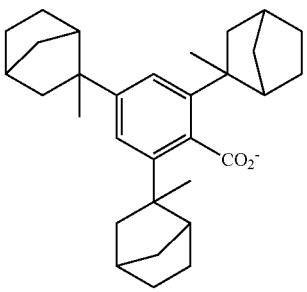
(A-47)
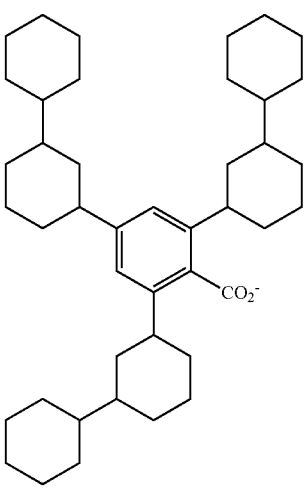
(A-48)
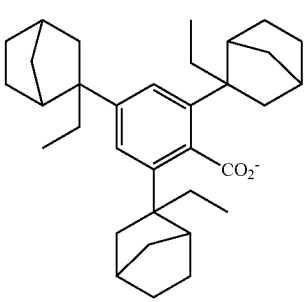
(A-49)
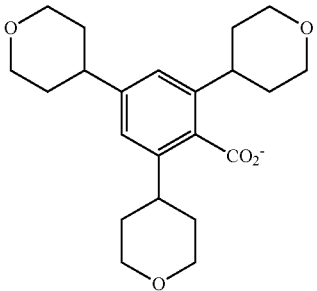

-continued
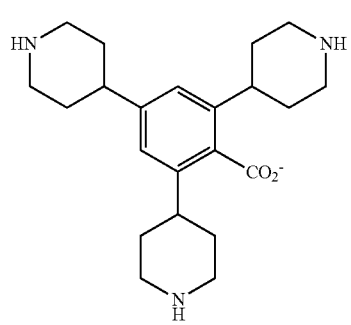
(A-50)
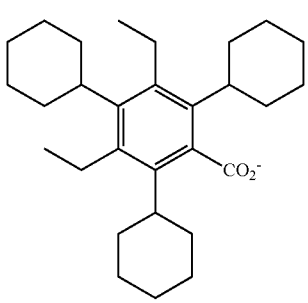
(A-51)
(A-52)
(A-53)
-continued
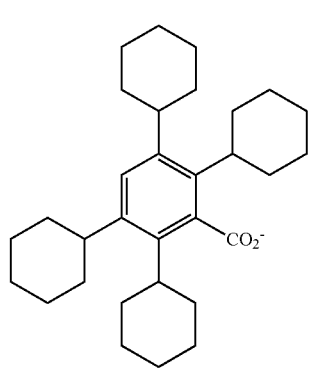
(A-54)
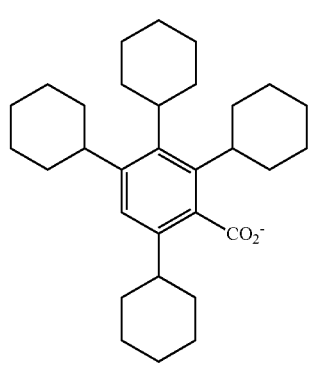
(A-55)
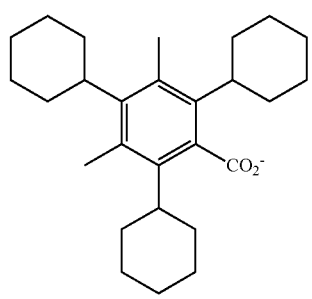
(A-56)
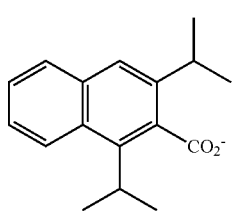
(A-57)
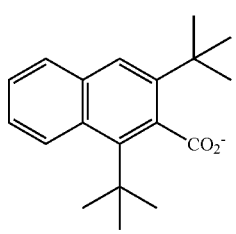
(A-58)

-continued
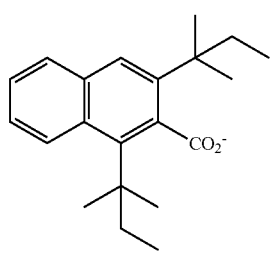
(A-59)
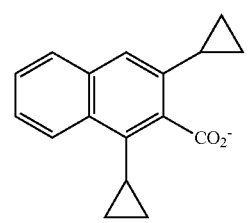
(A-60)
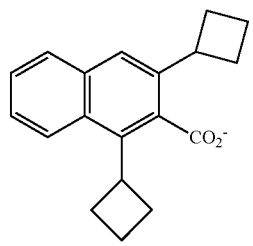
(A-61)
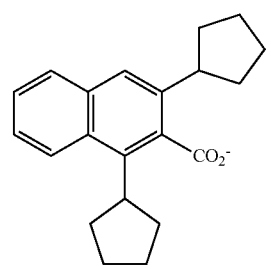
(A-62)
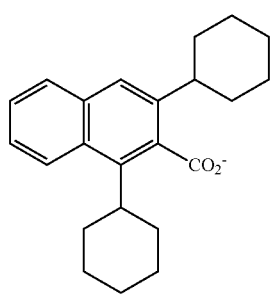
(A-63)
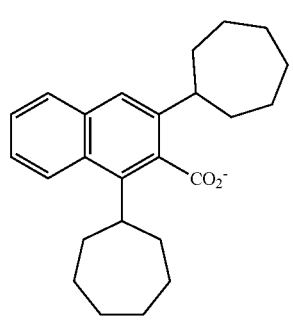
(A-64)
-continued
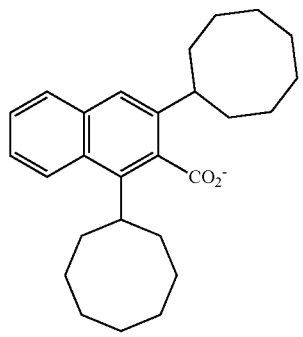
(A-65)
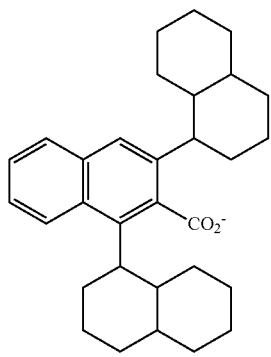
(A-66)
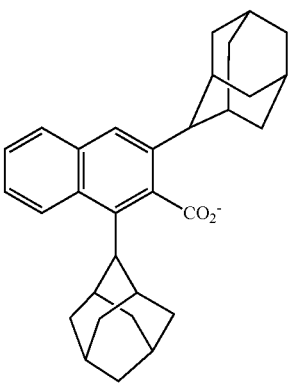
(A-67)
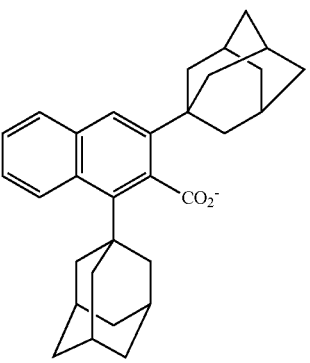
(A-68)

-continued
(A-69) 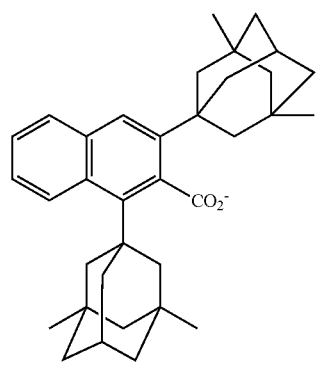
(A-70) 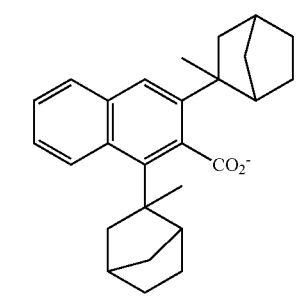
(A-71) 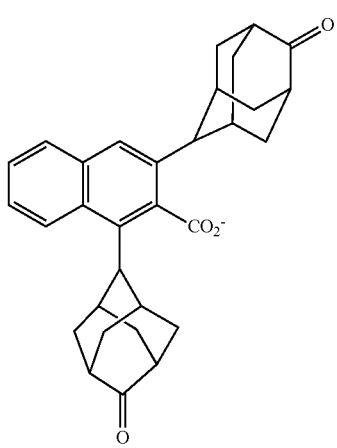
(A-72) 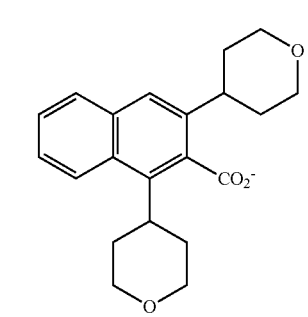
-continued
(A-73) 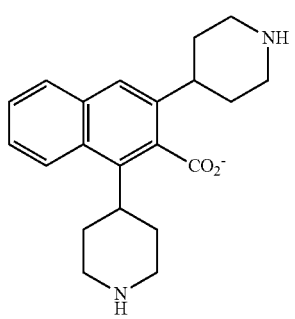
(A-74) 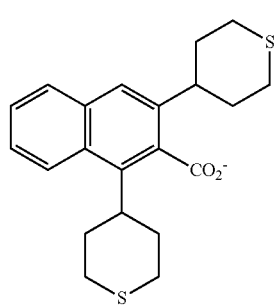
(A-75) 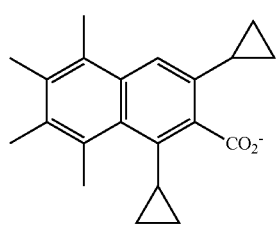
(A-76) 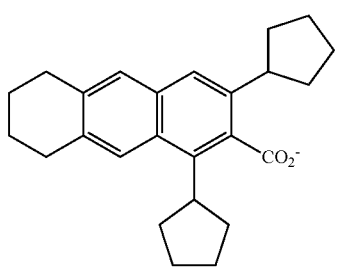
(A-77) 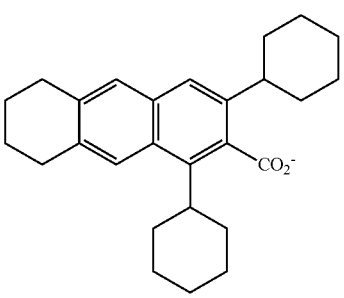

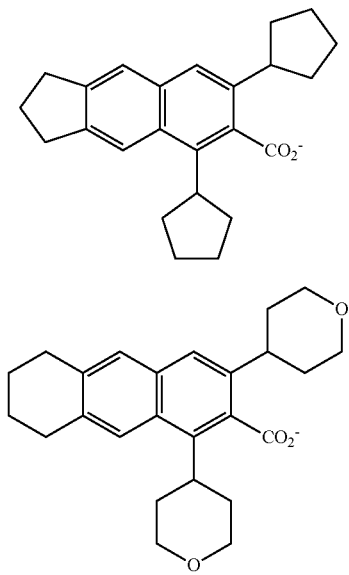

(A-78)

(A-79)

Of these, structures (A-30) to (A-44) are especially preferred as the anion moiety in the sulfonium salt. A sulfonium salt having an anion of such structure is best suited for use in resist compositions, because it is highly lipophilic, despite a carboxylic acid salt, by virtue of a branched or alicyclic hydrocarbon on an aromatic ring, and because the carboxylic acid generated therefrom is restricted in diffusion by the surrounding steric hindrance.

In formula (1), $R^{101}$, $R^{102}$ and $R^{103}$ are each independently a straight $C_1$-$C_{20}$ or branched or cyclic $C_3$-$C_{20}$ monovalent hydrocarbon group which may be substituted with or separated by a heteroatom, or any two or more of $R^{101}$, $R^{102}$ and $R^{103}$ may bond together to form a ring with the sulfur atom in the formula. Suitable monovalent hydrocarbon groups include alkyl groups such as methyl, ethyl, n-propyl, isopropyl, n-butyl, tert-butyl, cyclopropyl, cyclopentyl, cyclohexyl, cyclopropylmethyl, 4-methylcyclohexyl, cyclohexylmethyl, norbornyl, and adamantyl; alkenyl groups such as vinyl, allyl, propenyl, butenyl, hexenyl, and cyclohexenyl; aryl groups such as phenyl, naphthyl and thienyl; and aralkyl groups such as benzyl, 1-phenylethyl, and 2-phenylethyl, with the aryl groups being preferred. In these hydrocarbon groups, a hydrogen atom (or atoms) may be substituted by a heteroatom such as oxygen, sulfur, nitrogen or halogen, or a heteroatom such as oxygen, sulfur or nitrogen may intervene. As a result, a hydroxyl, cyano, carbonyl, ether bond, ester bond, sulfonic acid ester bond, carbonate bond, lactone ring, sultone ring, carboxylic anhydride or haloalkyl group may form or intervene.

Alternatively, any two or more of $R^{101}$, $R^{102}$ and $R^{103}$ may bond together to form a ring with the sulfur atom in the formula. Suitable cyclic structures are shown below.

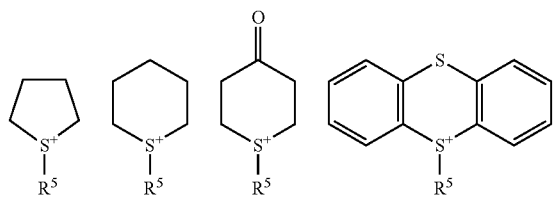

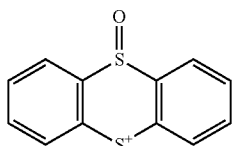

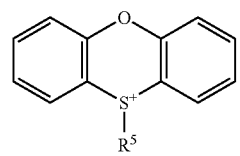

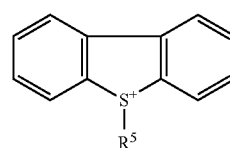

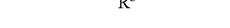

Herein $R^5$ is a group as defined and exemplified above for $R^{101}$, $R^{102}$, and $R^{103}$.

Examples of the preferred structure of the cation moiety in the sulfonium salt having formula (1) are shown below, but the invention is not limited thereto.

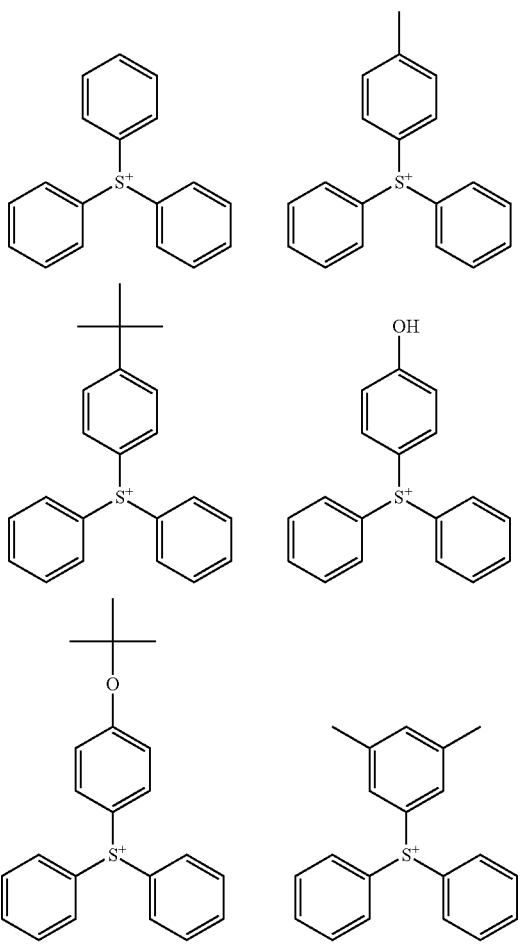

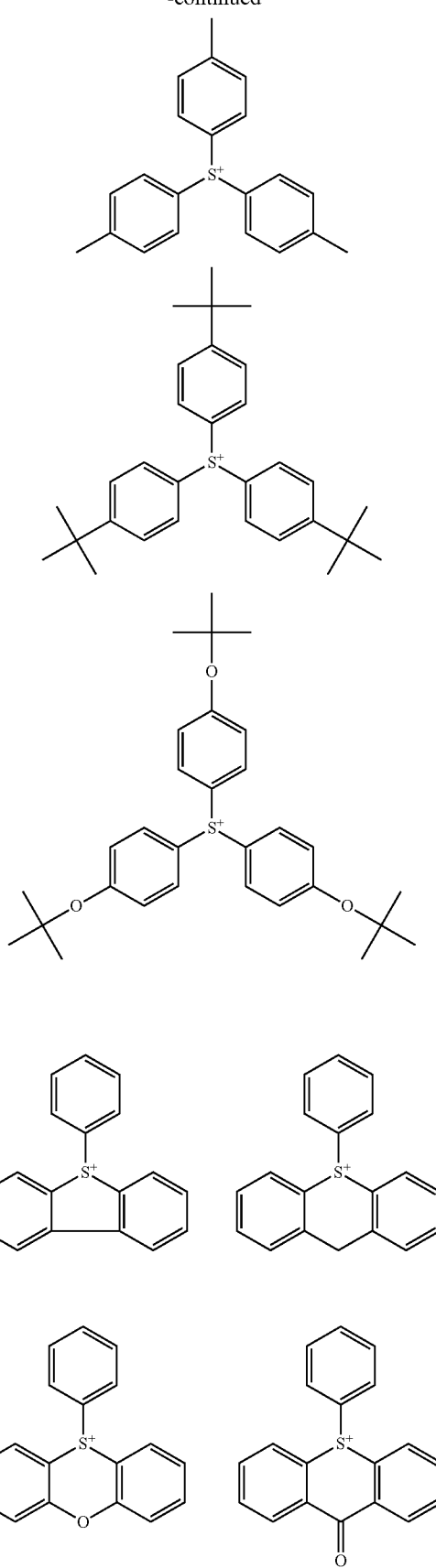

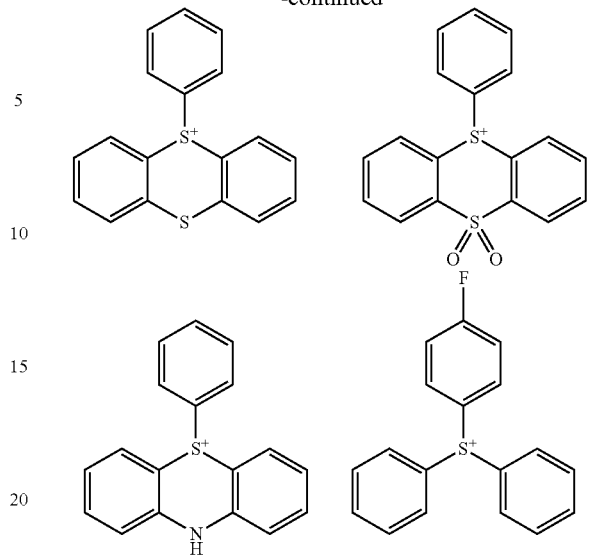

Exemplary structures for the sulfonium salt include arbitrary combinations of anions with cations, both as exemplified above.

In the resist composition, the sulfonium salt having formula (1) generates a corresponding arylcarboxylic acid upon exposure. The generated carboxylic acid has a pKa value of about 3.0 to 4.0, that is, relatively low acidity. Thus the generated carboxylic acid is insufficient to incur deprotection reaction by breaking the acetal bond protecting a phenolic hydroxyl group on the polymer in the resist composition.

Nevertheless, the sulfonium salt having formula (1) can serve as an acid diffusion regulator. When the sulfonium salt having formula (1) is used as an acid diffusion regulator along with a PAG capable of generating an acid having high acidity, typically an alkane- or arenesulfonic acid, a resist pattern having low roughness is formed as compared with the use of conventional amine type acid diffusion regulators.

This may be accounted for by the following mechanism. When the sulfonium salt having formula (1) is co-present with a strong acid-generating onium salt capable of generating an acid having relatively high acidity, the salts generate corresponding carboxylic acid and strong acid in a region exposed to radiation. In a less dose region, most of the onium salt remains undecomposed. The strong acid functions as a catalyst to trigger deprotection reaction to the base resin while the carboxylic acid generated by the sulfonium salt having formula (1) induces little deprotection reaction. The strong acid undergoes ion exchange with the remaining carboxylic acid sulfonium salt, whereupon an onium salt of strong acid is formed, and carboxylic acid is released instead. Differently stated, via ion exchange, the strong acid is neutralized with the inventive sulfonium salt.

In general, the onium salt type quenchers tend to form a resist pattern with a lower LER than the amine compound quenchers. The reason is as follows. Salt exchange between strong acid and carboxylic acid sulfonium salt is repeated infinitely. The site where strong acid is generated at the end of exposure is different from the initial site where the strong acid-generating onium salt is present. Since the cycle of photo-acid generation and salt exchange is repeated over and over, the acid generation point is averaged, which leads to a resist pattern with reduced LER after development.

Some examples of weak acid onium salt serving as the acid diffusion regulator are known in the art. For example, Patent Document 1 discloses triphenylsulfonium acetates, and Patent Document 2 describes sulfonic acid ammonium salts and carboxylic acid ammonium salts. These salts, however, fail to exert satisfactory performance, especially LER reduction, when applied to the advanced semiconductor materials under miniaturization requirement.

Patent Document 3 describes a resist composition for KrF and EB lithography, comprising a base resin having an acid labile group and a PAG capable of generating a fluorinated carboxylic acid. Since the fluorinated carboxylic acid has a higher acidity than the non-fluorinated carboxylic acid, it may react with the acid labile group on the base resin. It does not function as the acid diffusion regulator.

By contrast, the carboxylic acid sulfonium salt of the invention is characterized in that the anion moiety has a bulky structure of arenecarboxylate in which secondary or tertiary carbon atoms bond at both ortho-positions relative to the carbon atom in bond with carboxylate.

In general, the carboxylic acid onium salt is less soluble in resist solvents and tends to remain as foreign particles, causing defects. The onium salt of the invention is highly lipophilic and fully compatible with resist components, with a least possibility to cause defects as foreign particles.

Although the weak acid onium salt is generally insufficient to cleave the acid labile group on the base resin, there is still a possibility that it functions as a photoacid generator in a fully exposed region. Since the onium salt of the invention has steric hindrance around carboxylate as pointed out above, the carboxylic acid generated therefrom does not react with the acid labile group on the base resin and purely functions only as the acid diffusion regulator. As a result, the lithography performance, especially LER is improved over the conventional weak acid onium salts.

The resist composition of the invention is characterized by comprising the sulfonium salt of formula (1) and a polymer comprising recurring units of the general formula (U-1) as base resin.

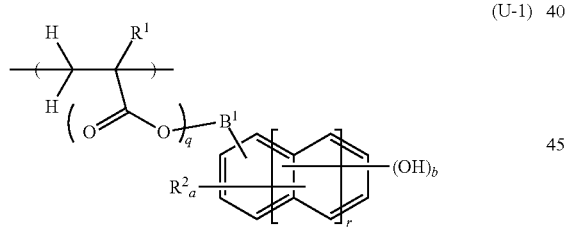

(U-1)

Herein q is 0 or 1, r is an integer of 0 to 2, $R^1$ is hydrogen, fluorine, methyl or trifluoromethyl, $R^2$ is each independently hydrogen or $C_1$-$C_6$ alkyl, $B^1$ is a single bond or $C_1$-$C_{10}$ alkylene which may contain an ether bond, a is an integer satisfying a≤5+2r−b, and b is an integer of 1 to 3.

Examples of the recurring unit having formula (U-1) are shown below.

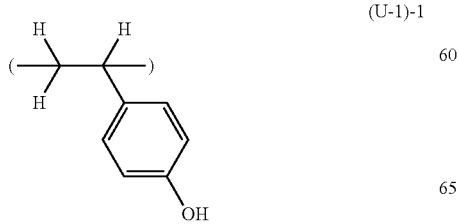

(U-1)-1

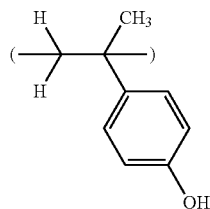

(U-1)-2

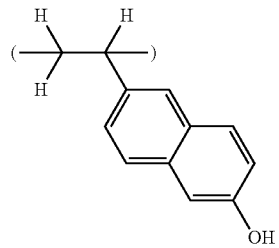

(U-1)-3

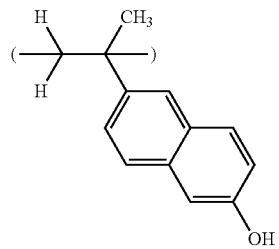

(U-1)-4

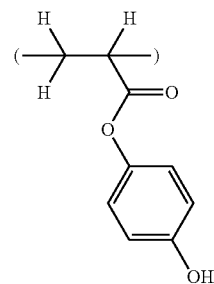

(U-1)-5

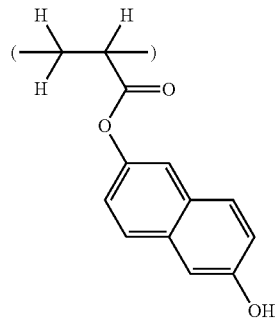

(U-1)-6

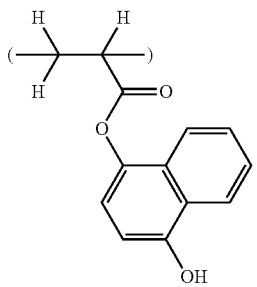

(U-1)-7

-continued
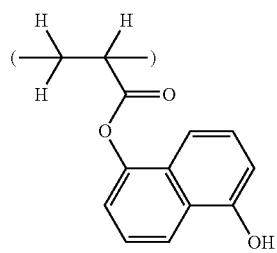
(U-1)-8
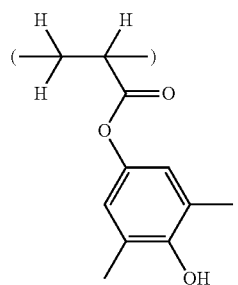
(U-1)-9
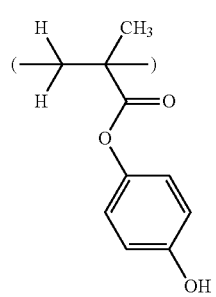
(U-1)-10
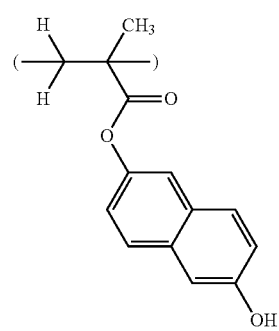
(U-1)-11
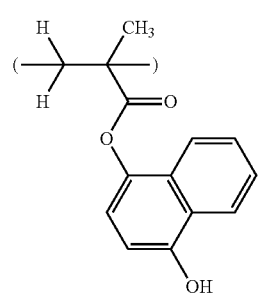
(U-1)-12
-continued
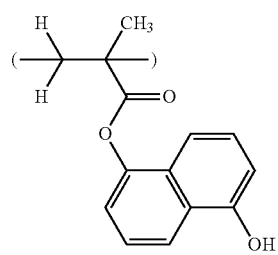
(U-1)-13
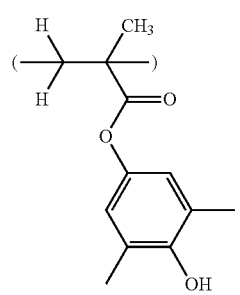
(U-1)-14
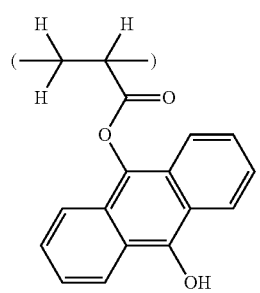
(U-1)-15
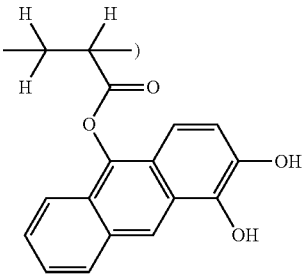
(U-1)-16
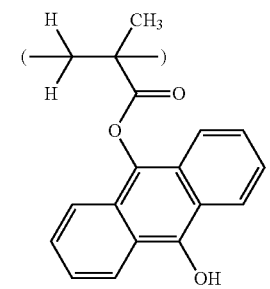
(U-1)-17

(U-1)-18
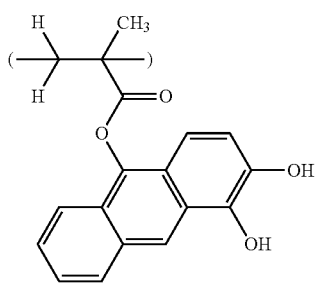

(U-1)-19
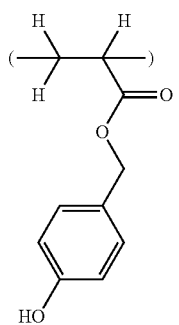

(U-1)-20
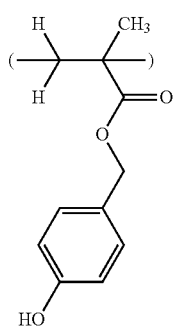

(U-1)-21
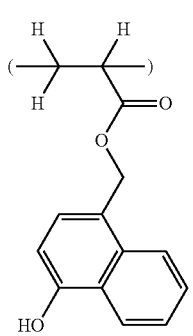

(U-1)-22
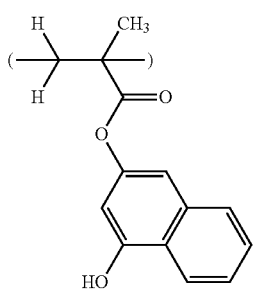

(U-1)-23
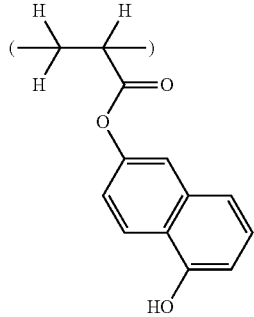

(U-1)-24
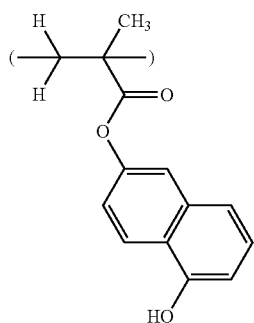

Of the illustrated units of formula (U-1), units (U-1)-1 to (U-1)-6 are preferred, with unit (U-1)-1 being most preferred.

While the recurring units of formula (U-1) are essential, the polymer may comprise other recurring units, preferably recurring units of the structure having the general formula (U-2).

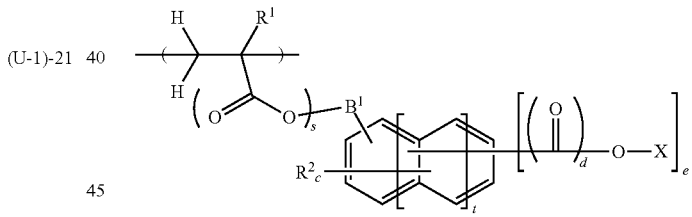
(U-2)

Herein s is 0 or 1, t is an integer of 0 to 2, $R^1$, $R^2$, and $B^1$ are as defined above, c is an integer satisfying $c \leq 5+2t-e$, d is 0 or 1, e is an integer of 1 to 3. When e is 1, X is an acid labile group. When e is 2 or 3, X is hydrogen or an acid labile group, at least one X being an acid labile group.

The acid labile group is typically selected from tertiary alkyl groups and acetal groups. Suitable tertiary alkyl groups include tert-butyl, tert-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]

dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

A typical acetal group is a partial structure having the general formula (U-5):

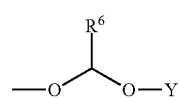
(U-5)

wherein $R^6$ is hydrogen or a straight, branched or cyclic $C_1$-$C_{10}$ alkyl group, and Y is a straight, branched or cyclic $C_1$-$C_{30}$ alkyl group.

Examples of the structure having formula (U-5) are shown below.

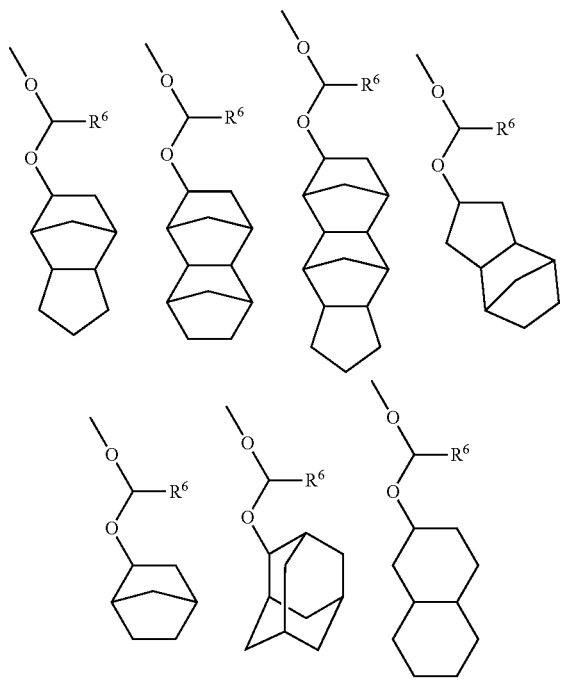

Herein $R^6$ is as defined above.

In formula (U-5), $R^6$ is hydrogen or a straight, branched or cyclic $C_1$-$C_{10}$ alkyl group. A choice of $R^6$ may depend on the designed sensitivity of acid labile group to acid. For example, hydrogen is selected when the acid labile group is designed to ensure relatively high stability and to be decomposed with strong acid. A straight alkyl group is selected when the acid labile group is designed to have relatively high reactivity and high sensitivity to pH changes. Although the choice varies with a particular combination of acid generator and basic compound in the resist composition, $R^6$ is preferably a group in which the carbon in bond with acetal carbon is secondary, when the acid labile group is designed to have a relatively large alkyl group substituted at the end and a substantial change of solubility upon decomposition. Examples of $R^6$ bonded to acetal carbon via secondary carbon include isopropyl, sec-butyl, cyclopentyl, and cyclohexyl.

Another choice of acid labile group is to bond (—$CH_2COO$-tertiary alkyl) to a phenolic hydroxyl group.

The tertiary alkyl group used herein may be the same tertiary alkyl group as used for the protection of phenolic hydroxyl group.

The polymer may further comprise recurring units having the general formula (U-3) and/or (U-4) as main constituent units.

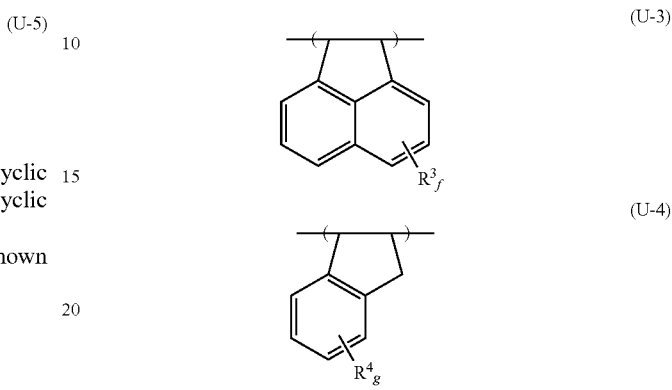

Herein f is an integer of 0 to 6, $R^3$ is each independently hydrogen, an optionally halo-substituted $C_1$-$C_6$ alkyl or primary or secondary alkoxy group, or an optionally halo-substituted $C_1$-$C_7$ alkylcarbonyloxy group, g is an integer of 0 to 4, and $R^4$ is each independently hydrogen, an optionally halo-substituted $C_1$-$C_6$ alkyl or primary or secondary alkoxy group, or an optionally halo-substituted $C_1$-$C_7$ alkylcarbonyloxy group.

Where recurring units of at least one type selected from units of formula (U-3) and units of formula (U-4) are incorporated, the polymer may have another advantage that the binding of cyclic structure to the backbone enhances resistance to EB (to be irradiated during etching and pattern inspection), in addition to the advantage of etch resistance inherent to aromatic ring.

In the polymer, recurring units other than the units (U-1) to (U-4) may be incorporated. For example, (meth)acrylate units protected with an acid labile group as mentioned above and/or (meth)acrylate units having an adhesive group such as lactone structure may be used.

The polymer used herein may be prepared by any well-known techniques, by selecting suitable monomers and effecting copolymerization while optionally combining protection and deprotection reactions. The copolymerization reaction is preferably radical or anionic polymerization though not limited thereto. Reference may be made to WO 2006/121096, JP-A 2008-102383, JP-A 2008-304590, and JP-A 2004-115630.

The polymer used herein preferably has a weight average molecular weight (Mw) of 2,000 to 50,000, and more preferably 3,000 to 20,000, as measured by GPC using polystyrene standards. As is well known in the art, a polymer with a Mw of at least 2,000 avoids the phenomenon that a pattern is rounded at the top, reduced in resolution, and degraded in LER. If Mw is higher than the necessity, there is a tendency of increasing LER, depending on a particular pattern to be resolved. Thus the polymer is preferably controlled to a Mw of up to 50,000, and more preferably to a Mw of up to 20,000 particularly when a pattern with a line width of up to 100 nm is to be formed. Notably, the GPC measurement may use tetrahydrofuran (THF) solvent as commonly used.

The polymer used herein should preferably have a narrow dispersity (Mw/Mn) of 1.0 to 2.0, especially 1.0 to 1.8. A polymer with narrow dispersity avoids the phenomenon that foreign particles are left on the pattern after development or the pattern is degraded in profile.

In the polymer used herein, recurring units derived from monomers are preferably incorporated in the following molar fraction (mol %), although the invention is not limited thereto. The polymer preferably comprises:

(I) 35 to 94 mol %, more preferably 40 to 90 mol %, and even more preferably 55 to 85 mol % of units of at least one type selected from constituent units having formula (U-1);

(II) 5 to 45 mol %, more preferably 5 to 40 mol %, and even more preferably 5 to 30 mol % of units of at least one type selected from constituent units having formula (U-2); optionally, (III) 1 to 20 mol %, more preferably 5 to 20 mol %, and even more preferably 5 to 15 mol % of units of at least one type selected from constituent units having formulae (U-3) and (U-4); and optionally, (IV) 0 to 30 mol %, more preferably 0 to 20 mol %, and even more preferably 0 to 15 mol % of units of at least one type selected from constituent units derived from other monomers.

Preferably, a photoacid generator (PAG) is added to the resist composition in order that the composition function as a chemically amplified resist composition, especially chemically amplified positive resist composition. The PAG may be any compound capable of generating an acid upon exposure to high-energy radiation. Preferred is a PAG capable of generating an acid selected from sulfonic acids, imidic acids, and methide acids, upon exposure to high-energy radiation. Suitable PAGs include sulfonium salts, iodonium salts, sulfonyldiazomethane, N-sulfonyloxyimide, and oxime-O-sulfonate compounds, which may be used alone or in admixture of two or more.

Sulfonium salts are salts of sulfonium cations with anions which are typically selected from sulfonates, bis(substituted alkylsulfonyl)imides and tris(substituted alkylsulfonyl)methides. Exemplary sulfonates include trifluoromethanesulfonate, pentafluoroethanesulfonate, heptafluoropropanesulfonate, nonafluorobutanesulfonate, tridecafluorohexanesulfonate, 2,2,2-trifluoroethanesulfonate, pentafluorobenzenesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yloxycarbonyl)difluoromethanesulfonate, and 4-oxo-1-adamantyloxycarbonyldifluoromethanesulfonate. Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Sulfonium salts based on combination of these anions with the aforementioned cations are included.

Of the above-mentioned acid generators, PAGs of aryl or alkane-sulfonate type are preferred because they generate acids having an appropriate acid strength to deprotect the acid labile group on the acid labile group-bearing units having formula (U-2). The acid generator is typically used in an amount of 0.1 to 40 parts, more preferably 1 to 20 parts by weight per 100 parts by weight of the base resin.

A basic compound may be added to the chemically amplified resist composition. The addition of a basic compound is effective for controlling acid diffusion. The basic compound is typically used in an amount of 0.01 to 5 parts, more preferably 0.05 to 3 parts by weight per 100 parts by weight of the base resin. A number of basic compounds are known. Suitable basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts. Numerous examples of these compounds are described in Patent Document 6. Any basic compounds may be used alone or in admixture of two or more. Inter alia, tris(2-(methoxymethoxy)ethyl)amine, tris(2-(methoxymethoxy)ethyl)amine N-oxide, morpholine derivatives, and imidazole derivatives are preferred.

A surfactant may be added to the chemically amplified resist composition. Any suitable one may be selected from those surfactants commonly used for facilitating coating operation. A number of suitable surfactants are known, for example, from WO 2006/121096, JP-A 2008-102383, JP-A 2008-304590, JP-A 2004-115630, and JP-A 2005-008766. The surfactant is typically used in an amount of up to 2 parts, more preferably 0.01 to 1 part by weight per 100 parts by weight of the base resin.

Process

Another embodiment of the invention is a pattern forming process using the resist composition defined above. A pattern may be formed from the resist composition using any well-known lithography process. The preferred process includes at least the steps of forming a resist film on a substrate, exposing it patternwise to high-energy radiation, and developing it in an alkaline developer. The resist composition is applied onto a substrate for integrated circuit fabrication (e.g., Si, SiO$_2$, SiN, SiON, TiN, WSi, BPSG, SOG or organic antireflective coating) or a substrate for mask circuit fabrication (e.g., Cr, CrO, CrON or MoSi) by a suitable coating technique such as spin coating. The coating is prebaked on a hot plate at a temperature of 60 to 150° C. for 1 to 20 minutes, preferably 80 to 140° C. for 1 to 10 minutes, to form a resist film of 0.05 to 2.0 µm thick.

The resist film is then exposed by the lithography. Specifically, the resist film is subjected to direct beam writing or exposed to high-energy radiation such as DUV, excimer laser, X-ray or EB through a mask having the desired pattern in a dose of 1 to 200 mJ/cm$^2$, and preferably 10 to 100 mJ/cm$^2$. The chemically amplified resist composition of the invention is best suited for pattern imaging with EUV or EB. The exposure step may be performed by standard lithography. If desired, the immersion lithography using a liquid, typically water between the mask and the resist film is applicable. In this case, a protective film which is insoluble in water may be formed on the resist film.

After exposure, the resist film is baked (PEB) on a hot plate at 60 to 150° C. for 1 to 20 minutes, and preferably at 80 to 140° C. for 1 to 10 minutes. This is followed by development in a developer which is an alkaline aqueous solution, typically an aqueous solution of 0.1 to 5 wt %, more typically 2 to 3 wt % of tetramethylammonium hydroxide (TMAH). Development may be carried out by a conventional method such as dip, puddle, or spray development for 0.1 to 3 minutes, and preferably 0.5 to 2 minutes. These steps result in the formation of the desired positive pattern on the substrate.

One advantage of the resist composition is high etch resistance. Also the resist composition is effective when it is required that the pattern experience a minimal change of line width with a post-exposure delay (PED), i.e., when the duration between exposure and PEB is prolonged. The resist composition is effectively applicable to a processable substrate, specifically a substrate having a surface layer of material to which a resist film is less adherent and which is likely to invite pattern stripping or pattern collapse, and particularly a substrate having sputter deposited thereon metallic chromium or a chromium compound containing at least one light element selected from oxygen, nitrogen and carbon. The invention is effective for pattern formation on photomask blanks.

EXAMPLE

Examples of the invention are given below by way of illustration and not by way of limitation. Mw and Mn are weight and number average molecular weights, respectively, as measured by GPC versus polystyrene standards, and Mw/Mn is a polydispersity index. Me stands for methyl.

Synthesis Example 1

Synthesis of Carboxylic Acid Sulfonium Salt

Carboxylic acid sulfonium salts were synthesized by the following procedure.

Synthesis Example 1-1

Synthesis of 2,4,6-triisopropylbenzoic acid (Intermediate #1)

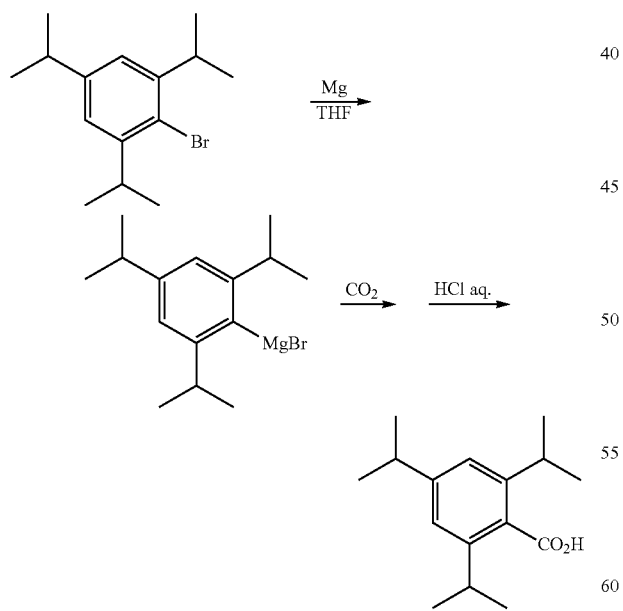

A Grignard reagent was prepared from 56.7 g of 1-bromo-2,4,6-triisopropylbenzene and poured to 300 g of dry ice, whereupon dry ice sublimated. Hydrochloric acid was added to the reaction mixture for quenching, followed by extraction with 200 g of toluene. The organic layer was taken out, washed with water, and combined with 10 wt % sodium hydroxide aqueous solution. The aqueous layer was taken out, combined with 50 g of 35 wt % hydrochloric acid, and extracted with 200 g of toluene. The organic layer was washed with water again, and concentrated under reduced pressure. The concentrate was crystallized from 150 g of hexane. The crystal precipitate was filtered and dried, obtaining the target compound, 2,4,6-triisopropylbenzoic acid. Amount 39.7 g, yield 80%.

Synthesis Example 1-2

Synthesis of sodium 2,4,6-triisopropylbenzoate (Intermediate #2)

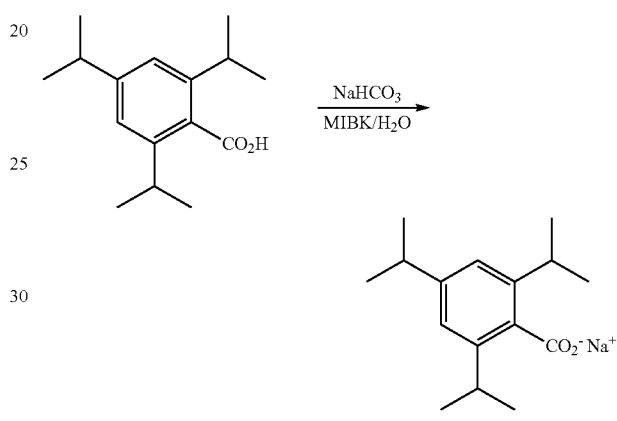

A 1-L eggplant shaped flask was charged with 39.7 g of 2,4,6-triisopropylbenzoic acid (prepared in Synthesis Example 1-1), 13.4 g of sodium hydrogencarbonate, 160 g of methyl isobutyl ketone, and 40 g of water, which were stirred at room temperature for 24 hours. At the end of stirring, the reaction solution was concentrated, followed by twice of azeotropic dehydration with 100 g of methyl isobutyl ketone. To the solid precipitate, 300 g of diisopropyl ether was added, whereupon solid-liquid washing was conducted for 30 minutes. The solid was filtered and dried, obtaining the target compound, sodium 2,4,6-triisopropylbenzoate as white crystal. Amount 30.7 g, yield 80%.

Synthesis Example 1-3

Synthesis of triphenylsulfonium 2,4,6-triisopropylbenzoate (Salt-1)

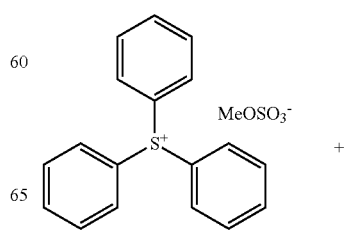

-continued

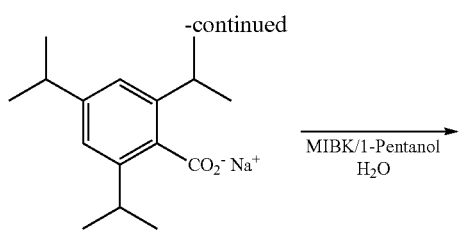

A 1-L eggplant shaped flask was charged with 22.4 g of sodium 2,4,6-triisopropylbenzoate (prepared in Synthesis Example 1-2), 31.1 g of triphenylsulfonium methylsulfate, 90 g of methyl isopropyl ketone, 90 g of 1-pentanol, and 40 g of water, which were stirred at room temperature for 1 hour. The organic layer was separated from the reaction mixture and washed with water. After washing, the organic layer was concentrated by distilling off the solvent. The liquid concentrate was crystallized from 300 g of diisopropyl ether. The crystal precipitate was filtered and dried, obtaining the target compound, triphenylsulfonium 2,4,6-triisopropylbenzoate as white crystal. Amount 40.4 g, yield 80%.

Synthesis Example 1-4

Synthesis of 2-bromo-1,3,5-tricyclohexylbenzene (Intermediate #3)

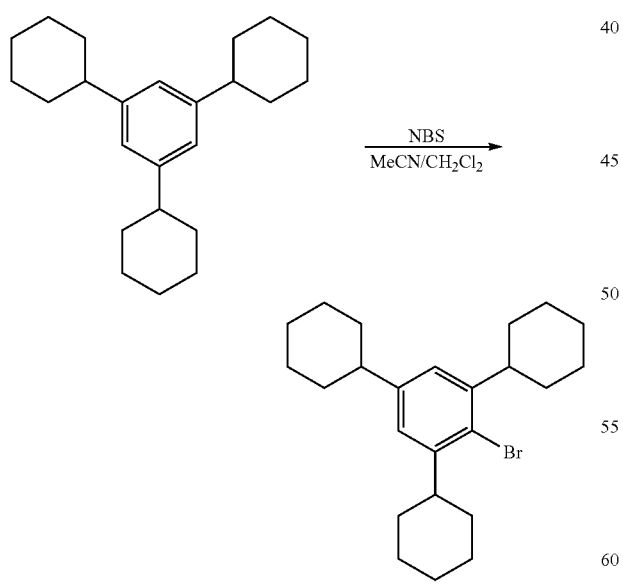

A 500-mL three-neck flask was charged with 15.7 g of N-bromosuccinimide and 100 g of acetonitrile. Under ice cooling, a dilute solution of 28.4 g of 1,3,5-tricyclohexylbenzene (prepared by known reaction) in 60 g of methylene chloride was added dropwise over 30 minutes. The solution was warmed to room temperature and aged for 12 hours. The resulting crystal precipitate was filtered, washed with acetonitrile and water, and dried, obtaining the target compound, 2-bromo-1,3,5-tricyclohexylbenzene as white crystal. Amount 28.4 g, yield 81%.

Synthesis Example 1-5

Synthesis of 2,4,6-tricyclohexylbenzoic acid (Intermediate #4)

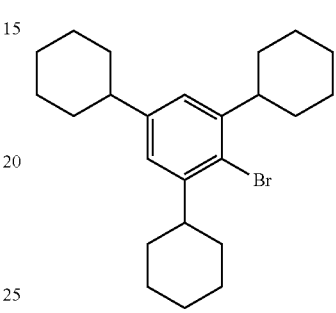

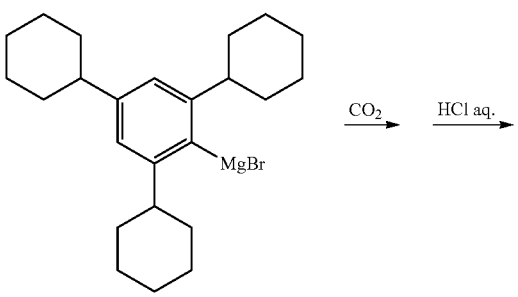

A Grignard reagent was prepared from 28.4 g of 2-bromo-1,3,5-tricyclohexylbenzene (prepared in Synthesis Example 1-4) and poured to 300 g of dry ice, whereupon dry ice sublimated. Hydrochloric acid was added to the reaction mixture for quenching, followed by extraction with 200 g of isopropyl ether. The organic layer was taken out, washed with water, and combined with 150 g of 10 wt % sodium hydroxide aqueous solution. The aqueous layer was taken out, combined with 100 g of 35 wt % hydrochloric acid, and extracted with 200 g of diisopropyl ether. The organic layer was washed with water again, and concentrated under reduced pressure. The concentrate was crystallized from 150 g of hexane. The crystal precipitate was filtered and dried, obtaining the target compound, 2,4,6-tricyclohexylbenzoic acid. Amount 39.7 g, yield 80%.

Synthesis Example 1-6

Synthesis of sodium 2,4,6-tricyclohexylbenzoate (Intermediate #5)

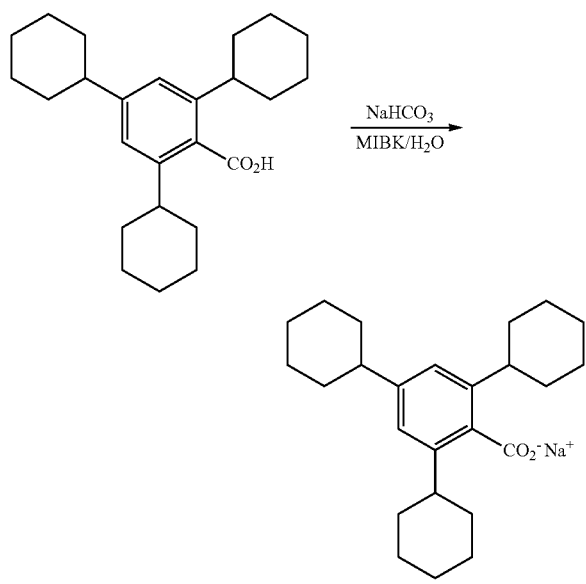

A 300-mL eggplant shaped flask was charged with 2.0 g of 2,4,6-tricyclohexylbenzoic acid (prepared in Synthesis Example 1-5), 0.5 g of sodium hydrogencarbonate, 10 g of methyl isobutyl ketone, and 10 g of water, which were stirred at room temperature. At the end of stirring, the reaction solution was concentrated, followed by twice of azeotropic dehydration with 30 g of methyl isobutyl ketone. To the solid precipitate, 30 g of acetonitrile was added, whereupon solid-liquid washing was conducted for 30 minutes. The solid was filtered and dried, obtaining the target compound, sodium 2,4,6-tricyclohexylbenzoate as white crystal. Amount 2.0 g, yield 90%.

Synthesis Example 1-7

Synthesis of triphenylsulfonium 2,4,6-tricyclohexylbenzoate (Salt-2)

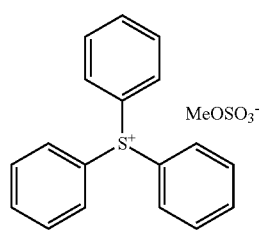

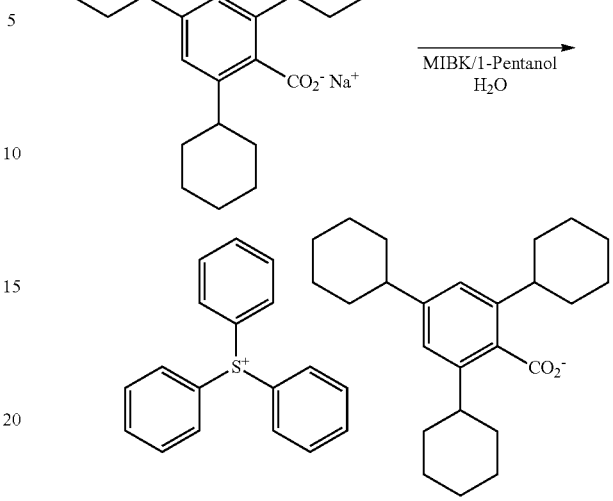

A 100-mL eggplant shaped flask was charged with 1.0 g of sodium 2,4,6-tricyclohexylbenzoate (prepared in Synthesis Example 1-6), 0.9 g of triphenylsulfonium methylsulfate, 10 g of methyl isopropyl ketone, 10 g of 1-pentanol, and 5 g of water, which were stirred at room temperature for 1 hour. The organic layer was separated from the reaction mixture and washed with water. After washing, the organic layer was concentrated by distilling off the solvent. The liquid concentrate was crystallized from 30 g of diisopropyl ether. The crystal precipitate was filtered and dried, obtaining the target compound, triphenylsulfonium 2,4,6-tricyclohexylbenzoate as white crystal. Amount 1.2 g, yield 76%.

Synthesis Example 1-8

Synthesis of 10-phenyl-10-phenoxathiinium methylsulfate (Intermediate #6)

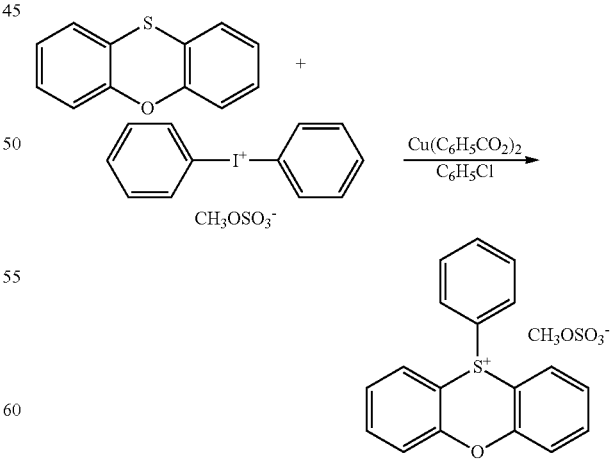

A mixture of 20 g of phenoxathiin, 43.1 g of diphenyliodonium methylsulfate, 0.9 g of copper(II) benzoate, and 210 g of chlorobenzene was heated and stirred at 120° C. for 3 hours. The reaction solution was cooled to room temperature and combined with 20 g of diisopropyl ether for crystallization. The solid was dried under reduced pressure, obtaining the target compound, 10-phenyl-10-phenoxathiinium methylsulfate. Amount 24.7 g, yield 63%.

Synthesis Example 1-9

Synthesis of 10-phenyl-10-phenoxathiinium 2,4,6-tricyclohexylbenzoate (Salt-3)

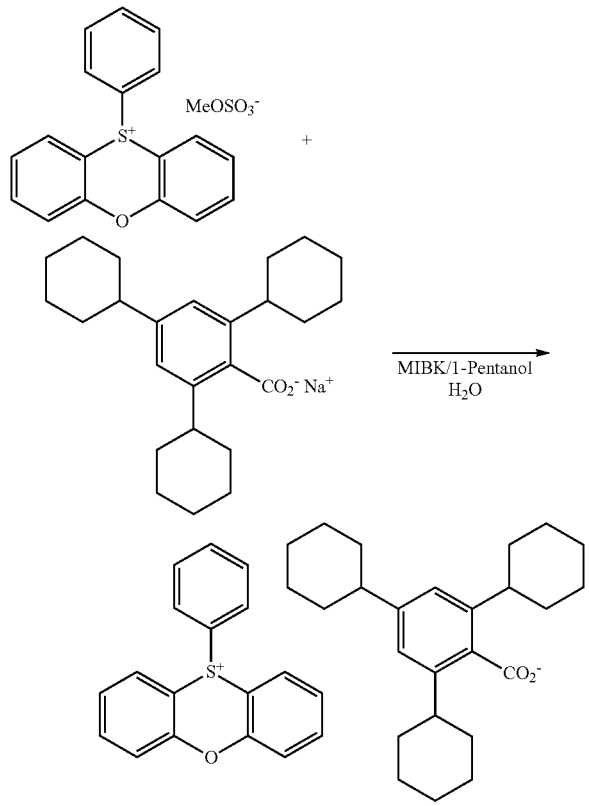

A 100-mL eggplant shaped flask was charged with 1.0 g of sodium 2,4,6-tricyclohexylbenzoate (prepared in Synthesis Example 1-6), 0.9 g of 10-phenyl-10-phenoxathiinium methylsulfate (prepared in Synthesis Example 1-8), 10 g of methyl isopropyl ketone, 10 g of 1-pentanol, and 5 g of water, which were stirred at room temperature for 1 hour. The organic layer was separated from the reaction mixture and washed with water. After washing, the organic layer was concentrated by distilling off the solvent. The liquid concentrate was crystallized from 30 g of diisopropyl ether. The crystal precipitate was filtered and dried, obtaining the target compound, 10-phenyl-10-phenoxathiinium 2,4,6-tricyclohexylbenzoate as white crystal. Amount 1.4 g, yield 88%.

Synthesis Example 2

Synthesis of Polymers

Polymers for use in resist compositions were synthesized according to the following formulation. The compositional proportion (in molar ratio) of polymers is shown in Table 1. The structure of recurring units is shown in Tables 2 to 4.

Synthesis Example 2-1

Synthesis of Polymer 1

A 3-L flask was charged with 407.5 g of acetoxystyrene, 42.5 g of acenaphthylene, and 1,275 g of toluene as solvent. The reactor was cooled at −70° C. in a nitrogen atmosphere, after which vacuum pumping and nitrogen flow were repeated three times. The reactor was warmed up to room temperature, whereupon 34.7 g of 2,2'-azobis(2,4-dimethylvaleronitrile) (V-65 by Wako Pure Chemical Industries, Ltd.) was added as polymerization initiator. The reactor was heated at 55° C., whereupon reaction ran for 40 hours. With stirring, a mixture of 970 g of methanol and 180 g of water was added dropwise to the reaction solution. After 30 minutes of standing, the lower layer (polymer layer) was concentrated under reduced pressure. The polymer layer concentrate was dissolved again in 0.45 L of methanol and 0.54 L of tetrahydrofuran (THF), to which 160 g of triethylamine and 30 g of water were added. The reaction mixture was heated at 60° C. for 40 hours for deprotection reaction. The reaction solution was concentrated under reduced pressure. To the concentrate, 548 g of methanol and 112 g of acetone were added for dissolution. With stirring, 990 g of hexane was added dropwise to the solution. After 30 minutes of standing, 300 g of THF was added to the lower layer (polymer layer). With stirring, 1,030 g of hexane was added dropwise thereto. After 30 minutes of standing, the lower layer (polymer layer) was concentrated under reduced pressure. The polymer solution was neutralized with 82 g of acetic acid. The reaction solution was concentrated, dissolved in 0.3 L of acetone, and poured into 10 L of water for precipitation. The precipitate was filtered and dried, yielding 280 g of a white polymer. The polymer was analyzed by $^1$H-NMR and GPC, with the results shown below.
Copolymer Compositional Ratio
hydroxystyrene:acenaphthylene=89.3:10.7
Mw=5,000
Mw/Mn=1.63

Under acidic conditions, 100 g of the polymer was reacted with 50 g of 2-methyl-1-propenyl methyl ether. This was followed by neutralization, phase separation, and crystallization, obtaining 125 g of a polymer, designated Polymer 1.

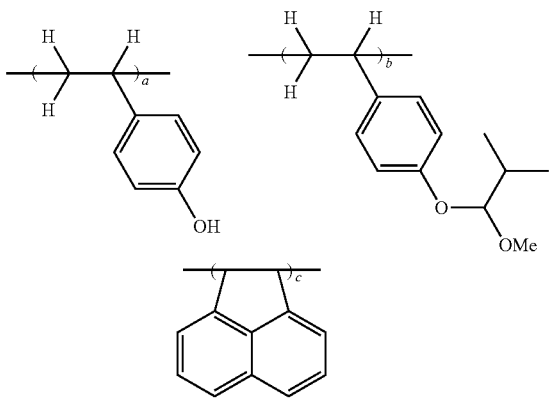

Polymer 1

($a:b:c = 70:20:10$)

Synthesis Example 2-2

Synthesis of Polymer 2

Polymer 2 was synthesized by the same procedure as in Synthesis Example 2-1 aside from using 2-methyl-1-propenyl 8-tricyclo[5.2.1.0$^{2,6}$]decanyl ether instead of 2-methyl-1-propenyl methyl ether.

Synthesis Example 2-3

Synthesis of Polymer 3

Polymer 3 was synthesized by the same procedure as in Synthesis Example 2-1 aside from using 2-methyl-1-propenyl 2-adamantyl ether instead of 2-methyl-1-propenyl methyl ether.

Synthesis Example 2-4

Synthesis of Polymer 4

In nitrogen atmosphere, 362 g of 4-hydroxyphenyl methacrylate, 38.2 g of acenaphthylene, 40.9 g of dimethyl 2,2'-azobis(2-methylpropionate) (V-601 by Wako Pure Chemical Industries, Ltd.), and 500 g of methyl ethyl ketone were fed into a dropping cylinder to form a monomer solution. A flask in nitrogen atmosphere was charged with 250 g of methyl ethyl ketone, which was heated at 80° C. with stirring. With stirring, the monomer solution was added dropwise to the flask over 4 hours. After the completion of dropwise addition, the polymerization solution was continuously stirred for 4 hours while maintaining its temperature at 80° C. The polymerization solution was cooled to room temperature, whereupon it was added dropwise to 10 kg of hexane/diisopropyl ether solution. The precipitate was collected by filtration, washed twice with 5 kg of hexane, and vacuum dried at 50° C. for 20 hours, obtaining a copolymer in white powder solid form. Under acidic conditions, 100 g of the polymer was reacted with 40.5 g of 2-methyl-1-propenyl methyl ether. This was followed by neutralization, phase separation, and crystallization, obtaining 128 g of a polymer, designated Polymer 4.

Synthesis Example 2-5

Synthesis of Polymer 5

Polymer 5 was synthesized by the same procedure as in Synthesis Example 2-4 aside from using 2-methyl-1-propenyl 8-tricyclo[5.2.1.0$^{2,6}$]decanyl ether instead of 2-methyl-1-propenyl methyl ether.

Synthesis Example 2-6

Synthesis of Polymer 6

Polymer 6 was synthesized by the same procedure as in Synthesis Example 2-4 aside from using 2-methyl-1-propenyl 2-adamantyl ether instead of 2-methyl-1-propenyl methyl ether.

Synthesis Examples 2-7 to 2-12

Synthesis of Polymers 7 to 12

Polymers containing hydroxystyrene units in Table 1 were synthesized by the same procedure as in Synthesis Example 2-1, 2-2 or 2-3 aside from changing the type and amount of monomers. Polymers containing 4-hydroxyphenyl methacrylate units in Table 1 were synthesized by the same procedure as in Synthesis Example 2-4, 2-5 or 2-6 aside from changing the type and amount of monomers.

Synthesis Example 2-13

Synthesis of Polymer 13

In nitrogen atmosphere, 42.4 g of 4-hydroxyphenyl methacrylate, 40.6 g of 5-oxo-4-oxatricyclo[4.2.1.0$^{3,7}$]nonan-2-yl methacrylate, 16.9 g of 1-methoxy-2-methyl-1-propyl methacrylate, 9.3 g of dimethyl 2,2'-azobis(2-methylpropionate) (V-601 by Wako Pure Chemical Industries, Ltd.), and 124 g of methyl ethyl ketone were fed into a dropping cylinder to form a monomer solution. A flask in nitrogen atmosphere was charged with 62 g of methyl ethyl ketone, which was heated at 80° C. with stirring. With stirring, the monomer solution was added dropwise to the flask over 4 hours. After the completion of dropwise addition, the polymerization solution was continuously stirred for 4 hours while maintaining its temperature at 80° C. The polymerization solution was cooled to room temperature, whereupon it was added dropwise to 1.5 kg of hexane/diisopropyl ether solution. The precipitate was collected by filtration, washed twice with 300 g of hexane, and vacuum dried at 50° C. for 20 hours, obtaining a copolymer in white powder solid form. It is designated Polymer 13.

Synthesis Examples 2-14 and 2-15

Synthesis of Polymers 14 and 15

Polymers in Table 1 were synthesized by the same procedure as in Synthesis Example 2-13 aside from changing the type and amount of monomers.

Synthesis Example 2-16

Synthesis of Polymer 16

In nitrogen atmosphere, 64.8 g of 4-acetoxystyrene, 9.1 g of acenaphthylene, 26.1 g of amyloxystyrene, 11.0 g of dimethyl 2,2'-azobis(2-methylpropionate) (V-601 by Wako Pure Chemical Industries, Ltd.), and 150 g of methyl ethyl ketone were fed into a dropping cylinder to form a monomer solution. A flask in nitrogen atmosphere was charged with 75 g of methyl ethyl ketone, which was heated at 80° C. with stirring. With stirring, the monomer solution was added dropwise to the flask over 4 hours. After the completion of dropwise addition, the polymerization solution was continuously stirred for 18 hours while maintaining its temperature at 80° C. The polymerization solution was cooled to room temperature, whereupon it was added dropwise to 1.5 kg of hexane/diisopropyl ether solution. The precipitate was collected by filtration and washed twice with 300 g of hexane. The copolymer was dissolved in 180 g of THF and 60 g of methanol, to which 24.4 g of ethanol amine was added. Under reflux, the solution was stirred for 3 hours. The reaction solution was concentrated under reduced pressure and dissolved in ethyl acetate. This was followed by neutralization, phase separation, and crystallization, obtaining Polymer 16. Amount 71 g.

Table 1 shows the proportion (in molar ratio) of units incorporated in these polymers, and Tables 2 to 4 show the structure of recurring units.

TABLE 1

| | Unit 1 | Proportion (mol %) | Unit 2 | Proportion (mol %) | Unit 3 | Proportion (mol %) |
|---|---|---|---|---|---|---|
| Polymer 1 | A-1 | 70.0 | B-1 | 20.0 | C-1 | 10.0 |
| Polymer 2 | A-1 | 78.0 | B-3 | 12.0 | C-1 | 10.0 |
| Polymer 3 | A-1 | 79.0 | B-5 | 11.0 | C-1 | 10.0 |
| Polymer 4 | A-2 | 67.0 | B-2 | 23.0 | C-1 | 10.0 |
| Polymer 5 | A-2 | 76.0 | B-4 | 14.0 | C-1 | 10.0 |
| Polymer 6 | A-2 | 77.0 | B-6 | 13.0 | C-1 | 10.0 |
| Polymer 7 | A-1 | 68.0 | B-1 | 22.0 | C-2 | 10.0 |
| Polymer 8 | A-1 | 76.0 | B-3 | 14.0 | C-2 | 10.0 |
| Polymer 9 | A-1 | 77.0 | B-5 | 13.0 | C-2 | 10.0 |
| Polymer 10 | A-2 | 64.0 | B-2 | 26.0 | C-2 | 10.0 |
| Polymer 11 | A-2 | 73.0 | B-4 | 17.0 | C-2 | 10.0 |
| Polymer 12 | A-2 | 74.0 | B-6 | 16.0 | C-2 | 10.0 |
| Polymer 13 | A-2 | 46.0 | B-7 | 19.0 | C-3 | 35.0 |
| Polymer 14 | A-2 | 50.0 | B-8 | 15.0 | C-3 | 35.0 |
| Polymer 15 | A-2 | 50.0 | B-9 | 15.0 | C-3 | 35.0 |
| Polymer 16 | A-1 | 67.0 | B-10 | 23.0 | C-1 | 10.0 |

TABLE 2

[Structure A-1: 4-hydroxyphenyl vinyl unit]

[Structure A-2: 4-hydroxyphenyl methacrylate unit]

TABLE 3

[Structure B-1]

TABLE 3-continued

[Structure B-2]

[Structure B-3]

[Structure B-4]

[Structure B-5]

TABLE 3-continued

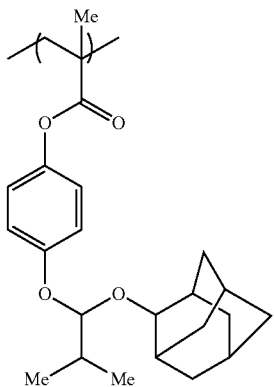 B-6

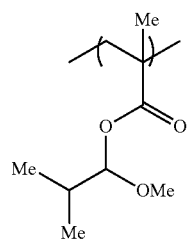 B-7

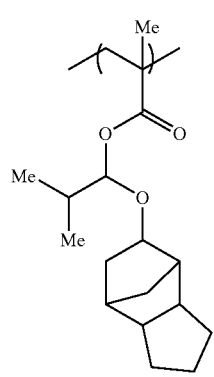 B-8

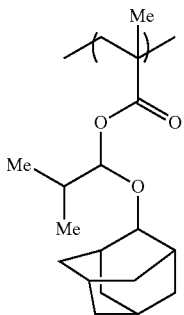 B-9

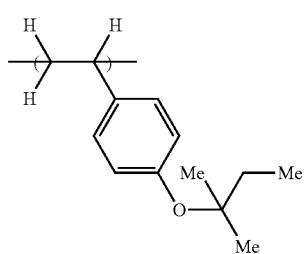 B-10

TABLE 4

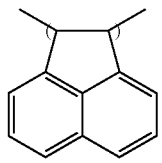 C-1

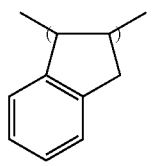 C-2

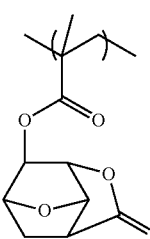 C-3

Preparation of Positive Resist Composition (A) Acid Diffusion Regulator:
  inventive salts (Salt-1 to Salt-3) or comparative salts (Comparative Salt-1 to Comparative Salt-6) of the structure shown in Table 6

(B) Polymer:
  polymers synthesized above (Polymer 1 to Polymer 16)

(C) Photoacid Generator:
  salts (PAG-1 to PAG-4) of the structure shown in Table 5

A positive resist composition in solution form was prepared by dissolving the components in an organic solvent in accordance with the formulation shown in Tables 7 and 8, and filtering through a filter with a pore size of 0.2 μm or a nylon or UPE filter with a pore size of 0.02 μm. The organic solvents in Tables 7 and 8 are PGMEA (propylene glycol monomethyl ether acetate), EL (ethyl lactate), PGME (propylene glycol monomethyl ether), and CyH (cyclohexanone). The composition contained 0.075 part of surfactant PF-636 (Omnova Solutions Inc.).

TABLE 5

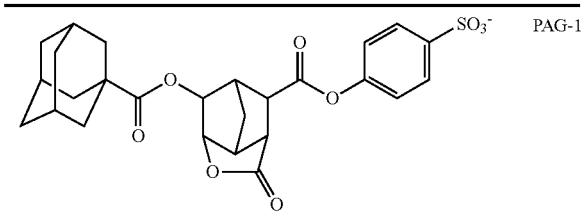 PAG-1

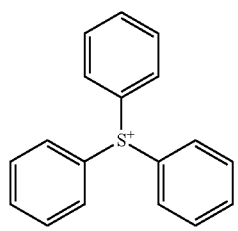 [SMILES: c1ccc([S+](c2ccccc2)c2ccccc2)cc1]

TABLE 5-continued
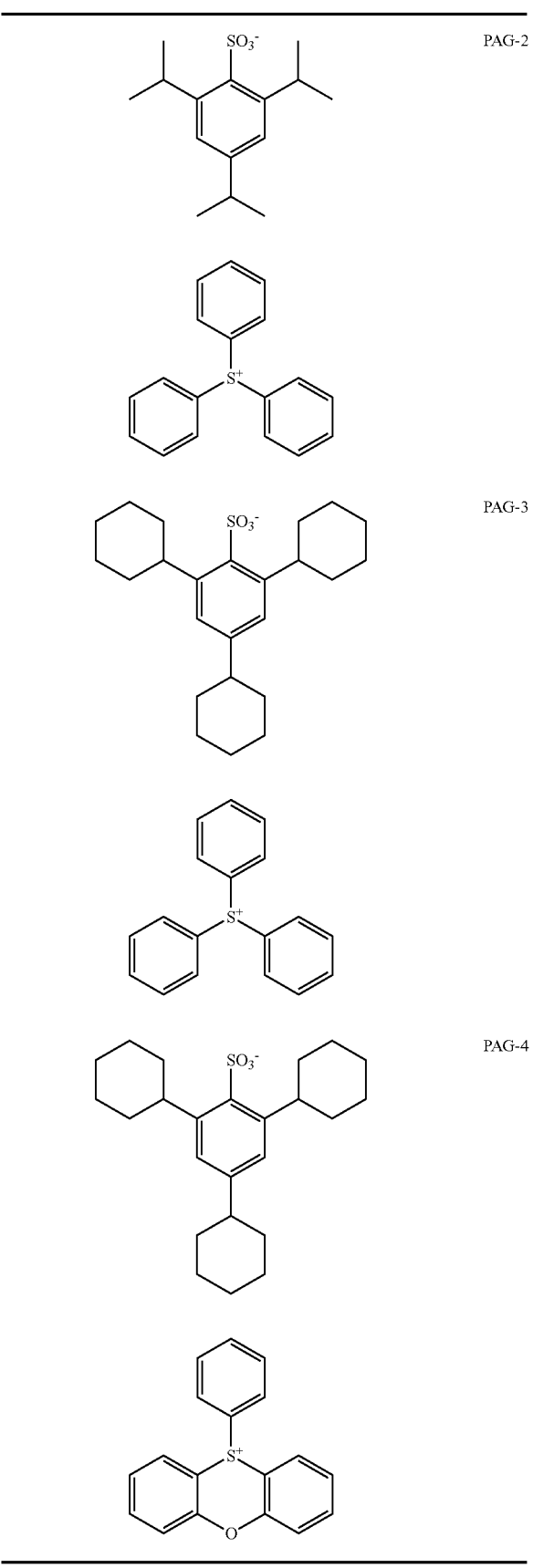
TABLE 6
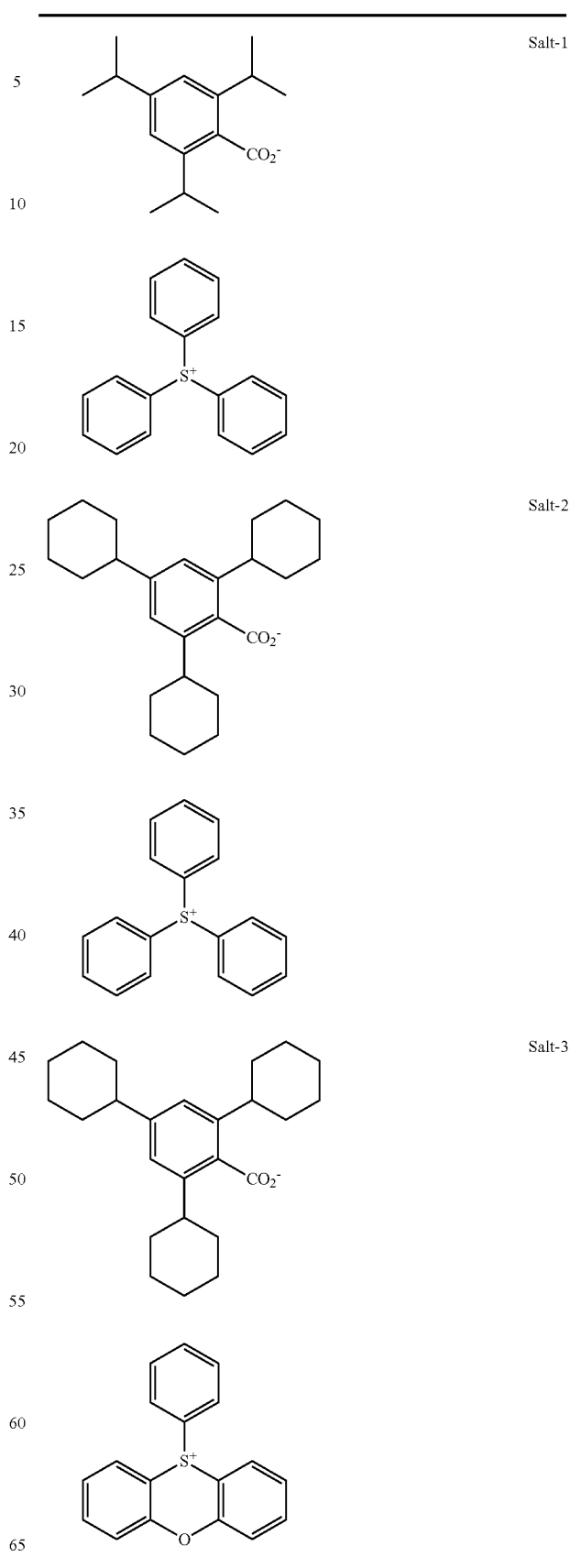

TABLE 6-continued

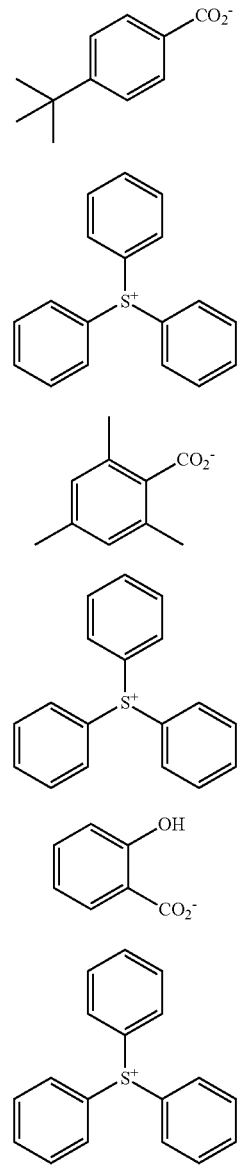

Comparative Salt-1

Comparative Salt-2

Comparative Salt-3

TABLE 6-continued

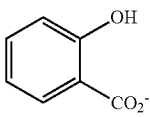

Comparative Salt-4

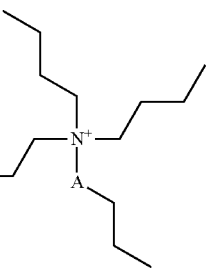

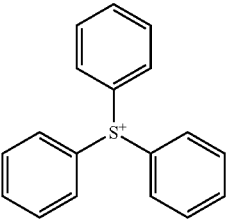 [SMILES: c1ccc([S+](c2ccccc2)c2ccccc2)cc1]

Comparative Salt-5

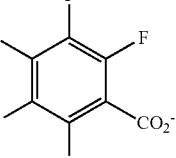

Comparative Salt-6

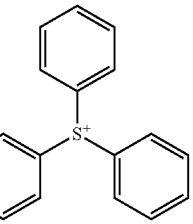

TABLE 7

|  | | Acid diffusion regulator (pbw) | Polymer (pbw) | PAG (pbw) | Solvent 1 (pbw) | Solvent 2 (pbw) | Solvent 3 (pbw) |
| --- | --- | --- | --- | --- | --- | --- | --- |
| Example | 1 | Salt-1(2.0) | Polymer 1(80) | PAG-4(8) | PGMEA(1,000) | EL(1,000) | PGME(1,300) |
|  | 2 | Salt-1(2.0) | Polymer 2(80) | PAG-4(8) | PGMEA(1,000) | EL(1,000) | PGME(1,300) |
|  | 3 | Salt-1(2.1) | Polymer 3(80) | PAG-4(8) | PGMEA(1,000) | EL(1,000) | PGME(1,300) |
|  | 4 | Salt-2(2.2) | Polymer 1(80) | PAG-4(8) | PGMEA(1,000) | EL(1,000) | PGME(1,300) |
|  | 5 | Salt-2(2.2) | Polymer 2(80) | PAG-4(8) | PGMEA(1,000) | EL(1,000) | PGME(1,300) |
|  | 6 | Salt-2(2.1) | Polymer 3(80) | PAG-4(8) | PGMEA(1,000) | EL(1,000) | PGME(1,300) |
|  | 7 | Salt-3(2.1) | Polymer 1(80) | PAG-4(8) | PGMEA(1,000) | EL(1,000) | PGME(1,300) |
|  | 8 | Salt-3(2.2) | Polymer 2(80) | PAG-4(8) | PGMEA(1,000) | EL(1,000) | PGME(1,300) |
|  | 9 | Salt-3(2.2) | Polymer 3(80) | PAG-4(8) | PGMEA(1,000) | EL(1,000) | PGME(1,300) |
|  | 10 | Salt-1(2.3) | Polymer 2(80) | PAG-4(10) | PGMEA(1,000) | EL(1,000) | PGME(1,300) |
|  | 11 | Salt-1(2.4) | Polymer 3(80) | PAG-4(10) | PGMEA(1,000) | EL(1,000) | PGME(1,300) |
|  | 12 | Salt-2(2.5) | Polymer 2(80) | PAG-4(10) | PGMEA(1,000) | EL(1,000) | PGME(1,300) |
|  | 13 | Salt-2(2.6) | Polymer 3(80) | PAG-4(10) | PGMEA(1,000) | EL(1,000) | PGME(1,300) |
|  | 14 | Salt-3(2.6) | Polymer 2(80) | PAG-4(10) | PGMEA(1,000) | EL(1,000) | PGME(1,300) |

TABLE 7-continued

| | | Acid diffusion regulator (pbw) | Polymer (pbw) | PAG (pbw) | Solvent 1 (pbw) | Solvent 2 (pbw) | Solvent 3 (pbw) |
|---|---|---|---|---|---|---|---|
| | 15 | Salt-3(2.6) | Polymer 3(80) | PAG-4(10) | PGMEA(1,000) | EL(1,000) | PGME(1,300) |
| | 16 | Salt-1(2.5) | Polymer 2(80) | PAG-2(5) PAG-3(5) | PGMEA(1,000) | EL(1,000) | PGME(1,300) |
| | 17 | Salt-1(2.7) | Polymer 2(80) | PAG-1(10) | PGMEA(1,000) | EL(1,000) | PGME(1,300) |
| | 18 | Salt-1(2.9) | Polymer 2(80) | PAG-3(12) | PGMEA(1,000) | EL(1,000) | PGME(1,300) |
| | 19 | Salt-1(3.0) | Polymer 2(80) | PAG-1(12) | PGMEA(1,000) | EL(1,000) | PGME(1,300) |
| | 20 | Salt-1(2.6) | Polymer 3(80) | PAG-3(10) | PGMEA(1,000) | EL(1,000) | PGME(1,300) |
| | 21 | Salt-1(2.7) | Polymer 3(80) | PAG-2(10) | PGMEA(1,000) | EL(1,000) | PGME(1,300) |
| | 22 | Salt-1(2.6) | Polymer 3(80) | PAG-2(5) PAG-3(5) | PGMEA(1,000) | EL(1,000) | PGME(1,300) |
| | 23 | Salt-1(3.0) | Polymer 3(80) | PAG-3(12) | PGMEA(1,000) | EL(1,000) | PGME(1,300) |
| | 24 | Salt-1(3.2) | Polymer 3(80) | PAG-2(12) | PGMEA(1,000) | EL(1,000) | PGME(1,300) |
| | 25 | Salt-1(2.1) | Polymer 4(80) | PAG-4(8) | PGMEA(1,000) | EL(1,000) | PGME(1,300) |
| | 26 | Salt-1(2.1) | Polymer 5(80) | PAG-4(8) | PGMEA(1,000) | EL(1,000) | PGME(1,300) |
| | 27 | Salt-1(2.1) | Polymer 6(80) | PAG-4(8) | PGMEA(1,000) | EL(1,000) | PGME(1,300) |
| | 28 | Salt-1(2.5) | Polymer 7(80) | PAG-2(10) | PGMEA(1,000) | EL(1,000) | PGME(1,300) |
| | 29 | Salt-1(2.2) | Polymer 8(80) | PAG-4(8) | PGMEA(1,000) | EL(1,000) | PGME(1,300) |
| | 30 | Salt-1(2.3) | Polymer 9(80) | PAG-4(8) | PGMEA(1,000) | EL(1,000) | PGME(1,300) |

TABLE 8

| | | Acid diffusion regulator (pbw) | Polymer (pbw) | PAG (pbw) | Solvent 1 (pbw) | Solvent 2 (pbw) | Solvent 3 (pbw) |
|---|---|---|---|---|---|---|---|
| Example | 31 | Salt-1(2.6) | Polymer 10(80) | PAG-2(10) | PGMEA(1,000) | EL(1,000) | PGME(1,300) |
| | 32 | Salt-1(2.3) | Polymer 11(80) | PAG-4(8) | PGMEA(1,000) | EL(1,000) | PGME(1,300) |
| | 33 | Salt-1(2.4) | Polymer 12(80) | PAG-4(8) | PGMEA(1,000) | EL(1,000) | PGME(1,300) |
| | 34 | Salt-1(2.5) | Polymer 2(80) | PAG-3(8) | PGMEA(1,000) | EL(1,000) | PGME(1,300) |
| | 35 | Salt-1(2.4) | Polymer 3(80) | PAG-3(8) | PGMEA(1,000) | EL(1,000) | PGME(1,300) |
| | 36 | Salt-2(2.6) | Polymer 2(80) | PAG-2(5) PAG-3(5) | PGMEA(1,000) | EL(1,000) | PGME(1,300) |
| | 37 | Salt-3(2.7) | Polymer 3(80) | PAG-2(5) PAG-3(5) | PGMEA(1,000) | EL(1,000) | PGME(1,300) |
| | 38 | Salt-1(2.4) | Polymer 8(80) | PAG-3(8) | PGMEA(1,000) | EL(1,000) | PGME(1,300) |
| | 39 | Salt-1(2.2) | Polymer 9(80) | PAG-3(8) | PGMEA(1,000) | EL(1,000) | PGME(1,300) |
| | 40 | Salt-1(2.3) | Polymer 8(80) | PAG-1(8) | PGMEA(1,000) | EL(1,000) | PGME(1,300) |
| | 41 | Salt-1(2.3) | Polymer 9(80) | PAG-1(8) | PGMEA(1,000) | EL(1,000) | PGME(1,300) |
| | 42 | Salt-1(1.8) | Polymer 16(80) | PAG-4(8) | PGMEA(1,000) | EL(1,000) | PGME(1,300) |
| | 43 | Salt-1(1.8) | Polymer 13(80) | PAG-4(8) | PGMEA(800) | CyH(1,600) | PGME(400) |
| | 44 | Salt-1(1.8) | Polymer 14(80) | PAG-4(8) | PGMEA(800) | CyH(1,600) | PGME(400) |
| | 45 | Salt-1(1.8) | Polymer 15(80) | PAG-4(8) | PGMEA(800) | CyH(1,600) | PGME(400) |
| Comparative Example | 1 | Comparative Salt-1(1.8) | Polymer 2(80) | PAG-4(8) | PGMEA(1,000) | EL(1,000) | PGME(1,300) |
| | 2 | Comparative Salt-1(1.9) | Polymer 3(80) | PAG-4(8) | PGMEA(1,000) | EL(1,000) | PGME(1,300) |
| | 3 | Comparative Salt-2(1.6) | Polymer 2(80) | PAG-4(8) | PGMEA(1,000) | EL(1,000) | PGME(1,300) |
| | 4 | Comparative Salt-2(1.6) | Polymer 3(80) | PAG-4(8) | PGMEA(1,000) | EL(1,000) | PGME(1,300) |
| | 5 | Comparative Salt-3(1.8) | Polymer 2(80) | PAG-4(8) | PGMEA(1,000) | EL(1,000) | PGME(1,300) |
| | 6 | Comparative Salt-3(1.8) | Polymer 3(80) | PAG-4(8) | PGMEA(1,000) | EL(1,000) | PGME(1,300) |
| | 7 | Comparative Salt-4(1.2) | Polymer 2(80) | PAG-4(8) | PGMEA(1,000) | EL(1,000) | PGME(1,300) |
| | 8 | Comparative Salt-4(1.2) | Polymer 3(80) | PAG-4(8) | PGMEA(1,000) | EL(1,000) | PGME(1,300) |
| | 9 | Comparative Salt-5(1.8) | Polymer 2(80) | PAG-4(8) | PGMEA(1,000) | EL(1,000) | PGME(1,300) |
| | 10 | Comparative Salt-5(1.8) | Polymer 3(80) | PAG-4(8) | PGMEA(1,000) | EL(1,000) | PGME(1,300) |
| | 11 | Comparative Salt-6(1.8) | Polymer 2(80) | PAG-4(8) | PGMEA(1,000) | EL(1,000) | PGME(1,300) |
| | 12 | Comparative Salt-6(1.8) | Polymer 3(80) | PAG-4(8) | PGMEA(1,000) | EL(1,000) | PGME(1,300) |
| | 13 | Comparative Salt-1(1.9) | Polymer 13(80) | PAG-4(8) | PGMEA(800) | CyH(1,600) | PGME(400) |
| | 14 | Comparative Salt-2(1.6) | Polymer 13(80) | PAG-4(8) | PGMEA(800) | CyH(1,600) | PGME(400) |

TABLE 8-continued

| | Acid diffusion regulator (pbw) | Polymer (pbw) | PAG (pbw) | Solvent 1 (pbw) | Solvent 2 (pbw) | Solvent 3 (pbw) |
|---|---|---|---|---|---|---|
| 15 | Comparative Salt-3(1.8) | Polymer 13(80) | PAG-4(8) | PGMEA(800) | CyH(1,600) | PGME(400) |
| 16 | Comparative Salt-4(1.2) | Polymer 13(80) | PAG-4(8) | PGMEA(800) | CyH(1,600) | PGME(400) |
| 17 | Comparative Salt-5(1.8) | Polymer 13(80) | PAG-4(8) | PGMEA(800) | CyH(1,600) | PGME(400) |
| 18 | Comparative Salt-6(1.8) | Polymer 13(80) | PAG-4(8) | PGMEA(800) | CyH(1,600) | PGME(400) |

Examples 1 to 42 and Comparative Examples 1 to 12

EB Writing Test

Using a coater/developer system ACT-M (Tokyo Electron Ltd.), each of the positive resist compositions (prepared above as Examples 1 to 42 and Comparative Examples 1 to 12) was spin coated onto a mask blank of 152 mm squares having a chromium oxynitride film at the outermost surface and prebaked on a hot plate at 120° C. for 600 seconds to form a resist film of 90 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB writer system EBM-5000Plus (NuFlare Technology Inc., accelerating voltage 50 keV), then baked (PEB) at 120° C. for 600 seconds, and developed in a 2.38 wt % tetramethylammonium hydroxide (TMAH) aqueous solution, thereby yielding positive patterns.

The patterned mask blank was observed under a top-down scanning electron microscope (TDSEM). The optimum exposure (Eop) was defined as the exposure dose ($\mu C/cm^2$) which provided a 1:1 resolution at the top and bottom of a 400-nm 1:1 line-and-space pattern. The maximum resolution of the resist was defined as the minimum line width of a line-and-space pattern that could be resolved at the optimum exposure. The LER of a 200-nm line-and-space pattern was measured under SEM. On observation in cross section of the resist pattern under SEM, it was visually judged whether or not the pattern profile was rectangular.

For evaluation of CDU, the line width of the pattern at the optimum exposure Eop ($\mu C/cm^2$) (which provided a 1:1 resolution of a 400-nm 1:1 line-and-space pattern) was measured at 49 points in the plane of the blank substrate excluding a peripheral band extending 20 mm inward from the blank periphery. A 3σ value was computed by subtracting the width at each measurement point from the average line width, and reported as CDU. Tables 9 and 10 show the results of evaluation of inventive and comparative resist compositions as patterned by EB writing.

TABLE 9

| | | Eop, $\mu C/cm^2$ | Maximum resolution, nm | LER, nm | CDU (3σ), nm | Pattern profile |
|---|---|---|---|---|---|---|
| Example | 1 | 21 | 40 | 4.9 | 2.5 | rectangular |
| | 2 | 24 | 40 | 4.8 | 2.4 | rectangular |
| | 3 | 25 | 40 | 4.9 | 2.4 | rectangular |
| | 4 | 21 | 40 | 4.8 | 2.5 | rectangular |
| | 5 | 25 | 40 | 4.6 | 2.4 | rectangular |
| | 6 | 20 | 40 | 4.7 | 2.5 | rectangular |
| | 7 | 24 | 40 | 4.7 | 2.5 | rectangular |
| | 8 | 20 | 40 | 4.8 | 2.4 | rectangular |
| | 9 | 24 | 40 | 4.6 | 2.1 | rectangular |
| | 10 | 22 | 40 | 4.9 | 2.2 | rectangular |
| | 11 | 21 | 40 | 4.8 | 2.2 | rectangular |
| | 12 | 21 | 45 | 4.6 | 2.3 | rectangular |
| | 13 | 25 | 40 | 4.7 | 2.3 | rectangular |
| | 14 | 23 | 45 | 4.8 | 2.1 | rectangular |
| | 15 | 20 | 40 | 4.6 | 2.5 | rectangular |
| | 16 | 22 | 45 | 4.6 | 2.3 | rectangular |
| | 17 | 21 | 45 | 4.6 | 2.3 | rectangular |
| | 18 | 24 | 40 | 4.6 | 2.4 | rectangular |
| | 19 | 23 | 45 | 4.8 | 2.4 | rectangular |
| | 20 | 25 | 45 | 4.6 | 2.5 | rectangular |
| | 21 | 25 | 40 | 4.8 | 2.1 | rectangular |
| | 22 | 20 | 40 | 5.0 | 2.4 | rectangular |
| | 23 | 20 | 45 | 4.8 | 2.1 | rectangular |
| | 24 | 23 | 40 | 5.0 | 2.4 | rectangular |
| | 25 | 22 | 45 | 4.6 | 2.5 | rectangular |
| | 26 | 22 | 40 | 4.8 | 2.2 | rectangular |
| | 27 | 24 | 45 | 5.0 | 2.1 | rectangular |
| | 28 | 23 | 45 | 4.8 | 2.5 | rectangular |
| | 29 | 23 | 45 | 4.8 | 2.3 | rectangular |
| | 30 | 23 | 40 | 4.5 | 2.2 | rectangular |

TABLE 10

| | | Eop, $\mu C/cm^2$ | Maximum resolution, nm | LER, nm | CDU (3σ), nm | Pattern profile |
|---|---|---|---|---|---|---|
| Example | 31 | 22 | 40 | 4.7 | 2.4 | rectangular |
| | 32 | 25 | 40 | 5.0 | 2.1 | rectangular |
| | 33 | 24 | 40 | 4.6 | 2.2 | rectangular |
| | 34 | 24 | 45 | 4.8 | 2.3 | rectangular |
| | 35 | 24 | 45 | 4.7 | 2.2 | rectangular |
| | 36 | 25 | 45 | 4.8 | 2.5 | rectangular |
| | 37 | 24 | 45 | 4.7 | 2.3 | rectangular |
| | 38 | 25 | 45 | 4.9 | 2.5 | rectangular |
| | 39 | 24 | 40 | 4.8 | 2.4 | rectangular |
| | 40 | 23 | 40 | 4.7 | 2.3 | rectangular |
| | 41 | 25 | 45 | 4.8 | 2.4 | rectangular |
| | 42 | 25 | 45 | 4.6 | 2.5 | rectangular |
| Comparative Example | 1 | 24 | 55 | 5.6 | 3.5 | rectangular |
| | 2 | 23 | 55 | 6.7 | 3.4 | rectangular |
| | 3 | 25 | 55 | 7.2 | 3.4 | rectangular |
| | 4 | 26 | 55 | 7.1 | 3.6 | rectangular |
| | 5 | 24 | 55 | 6.7 | 3.7 | rectangular |
| | 6 | 25 | 55 | 7.1 | 3.6 | rectangular |
| | 7 | 27 | 50 | 6.6 | 3.7 | rectangular |

TABLE 10-continued

| | Eop, µC/cm² | Maximum resolution, nm | LER, nm | CDU (3σ), nm | Pattern profile |
|---|---|---|---|---|---|
| 8 | 26 | 50 | 6.4 | 3.9 | rectangular |
| 9 | 7 | 65 | 8.8 | 4.5 | tapered |
| 10 | 8 | 65 | 8.9 | 4.8 | tapered |
| 11 | 6 | 65 | 8.7 | 2.1 | tapered |
| 12 | 7 | 65 | 8.5 | 5.0 | tapered |

Examples 43 to 45 and Comparative Examples 13 to 18

EUV Exposure Test

Each of the positive resist compositions (prepared above as Examples 43 to 45 and Comparative Examples 13 to 18) was spin coated on a silicon substrate (diameter 4 inches, vapor primed with hexamethyldisilazane (HMDS)) and prebaked on a hot plate at 105° C. for 60 seconds to form a resist film of 50 nm thick. EUV exposure was performed by dipole illumination at NA 0.3. Immediately after the exposure, the resist film was baked (PEB) on a hot plate for 60 seconds and puddle developed in a 2.38 wt % TMAH aqueous solution for 30 seconds to form a positive pattern.

The optimum exposure (Eop) is defined as the exposure dose that provides a 1:1 resolution of a 35-nm line-and-space pattern. Maximum resolution is a minimum size that can be resolved at Eop. The 35-nm line-and-space pattern was measured for LER under SEM. On observation in cross section of the resist pattern under SEM, it was visually judged whether or not the pattern profile was rectangular. The results of the resist compositions by EUV lithography test is shown in Table 11.

TABLE 11

| | | Eop, mJ/cm² | Maximum resolution, nm | LER, nm | Pattern profile |
|---|---|---|---|---|---|
| Example | 43 | 15 | 28 | 4.0 | rectangular |
| | 44 | 16 | 26 | 4.1 | rectangular |
| | 45 | 17 | 26 | 4.3 | rectangular |
| Comparative | 13 | 12 | 50 | 7.5 | tapered |
| Example | 14 | 12 | 55 | 7.3 | tapered |
| | 15 | 14 | 50 | 7.2 | tapered |
| | 16 | 13 | 50 | 6.9 | tapered |
| | 17 | 6 | 65 | 8.5 | tapered |
| | 18 | 6 | 65 | 8.9 | tapered |

As seen from the results in Tables 9, 10 and 11, the resist compositions containing the sulfonium salt of formula (1) within the scope of the invention (Examples 1 to 42 and Examples 43 to 45) as acid diffusion regulator exhibit a high resolution, satisfactory pattern rectangularity, and acceptable values of LER. In contrast, the resist compositions containing acid diffusion regulators of benzoic acid type having only one bulky substituent group or relatively low methyl as substituent group or of salicylic acid type (Comparative Examples 1 to 18) are inferior in resolution, PED, CDU, and LER. The resist compositions containing acid diffusion regulators of fluorocarboxylic acid type and pentafluorobenzoic acid type form patterns of tapered profile.

Although the reason is not well understood, the carboxylic acid sulfonium salt of the invention is characterized in that the anion moiety has a bulky structure of arenecarboxylate in which secondary or tertiary carbon atoms bond at both ortho-positions relative to the carbon atom in bond with carboxylate. Thus the inventive onium salt is more lipophilic than the comparative salts and fully compatible with resist components. Although the weak acid onium salt is generally insufficient to cleave the acid labile group on the base resin, there is still a possibility that it functions as a photoacid generator in a fully exposed region. Since the inventive onium salt has steric hindrance around carboxylate as pointed out above, the carboxylic acid generated by the onium salt does not react with the acid labile group on the base resin and purely functions only as the acid diffusion regulator. As a result, it improves the lithography performance, especially LER, PED and CDU over the comparative onium salts. The acid diffusion regulators of benzoic acid type (Comparative Examples 1 to 8 and 13 to 16) are so water soluble that they may penetrate into the unexposed region during alkaline development, whereby performance factors typically LER are degraded. The acid diffusion regulators of Comparative Examples 9 to 12, 17 and 18 generate carboxylic acids having a sufficiently high acidity to react with the acid labile group on the base resin, whereby the performance factors and pattern profile are degraded.

It has been demonstrated that using the resist composition within the scope of the invention, a pattern having minimal LER can be formed via exposure. The pattern forming process using the resist composition within the scope of the invention is advantageous in the photolithography for semiconductor device fabrication and photomask blank processing.

While the invention has been illustrated and described in typical embodiments, it is not intended to be limited to the details shown. Any modified embodiments having substantially the same features and achieving substantially the same results as the technical idea disclosed herein are within the spirit and scope of the invention.

Japanese Patent Application No. 2014-118577 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising (A) a sulfonium salt having the general formula (1) and (B) a polymer comprising recurring units having the general formula (U-1), which is decomposed under the action of acid to increase its solubility in alkaline developer,

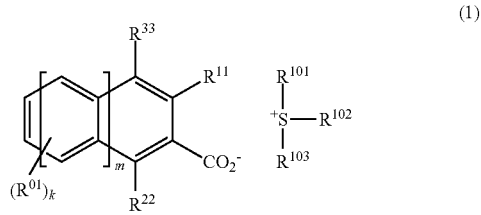

wherein $R^{11}$ and $R^{22}$ are each independently a branched or cyclic $C_3$-$C_{20}$ monovalent hydrocarbon group which may be substituted with or separated by a heteroatom, $R^{33}$ and $R^{01}$ are each independently hydrogen, or a straight $C_1$-$C_{20}$ or branched or cyclic $C_3$-$C_{20}$ monovalent hydrocarbon group which may be substituted with or separated by a heteroatom, k is an integer of 0 to 4, or $R^{11}$, $R^{22}$, $R^{33}$ and $R^{01}$ may bond together to form a ring with the carbon atoms to which they are attached and the carbon atom or atoms therebetween, m is 0 or 1, $R^{101}$, $R^{102}$ and $R^{103}$ are each independently a straight $C_1$-$C_{20}$ or branched or cyclic $C_3$-$C_{20}$ monovalent hydrocarbon group which may be substituted with or separated by a heteroatom, or any two or more of $R^{101}$, $R^{102}$ and $R^{103}$ may bond together to form a ring with the sulfur atom,

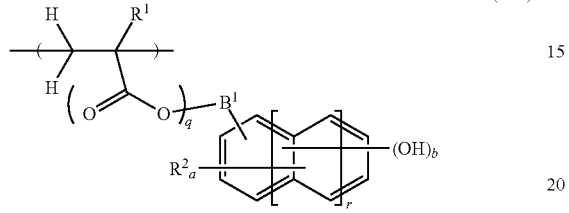
(U-1)

wherein q is 0 or 1, r is an integer of 0 to 2, $R^1$ is hydrogen, fluorine, methyl or trifluoromethyl, $R^2$ is each independently hydrogen or $C_1$-$C_6$ alkyl, $B^1$ is a single bond or $C_1$-$C_{10}$ alkylene which may contain an ether bond, a is an integer satisfying a≤5+2r−b, and b is an integer of 1 to 3.

2. The resist composition of claim 1 wherein component (A) is selected from the following sulfonium salts (A-30) to (A-44).

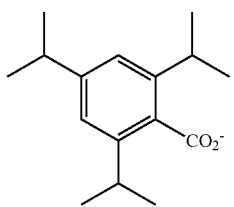
(A-30)

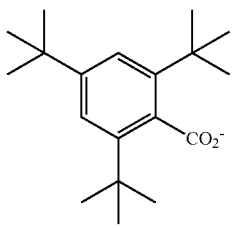
(A-31)

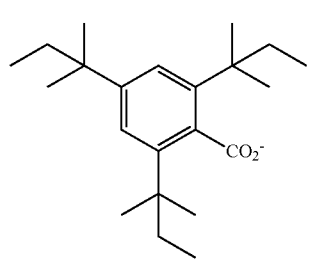
(A-32)

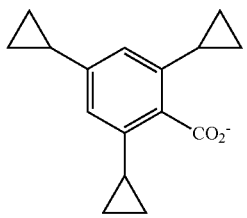
(A-33)

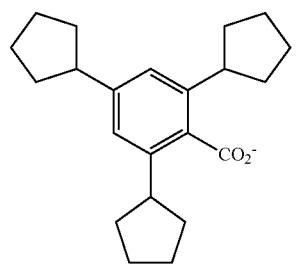
(A-34)

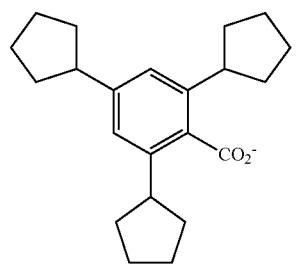
(A-35)

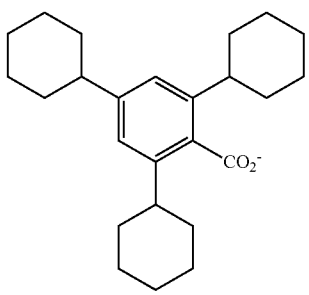
(A-36)

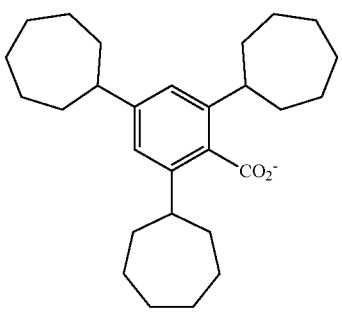
(A-37)

(A-38)
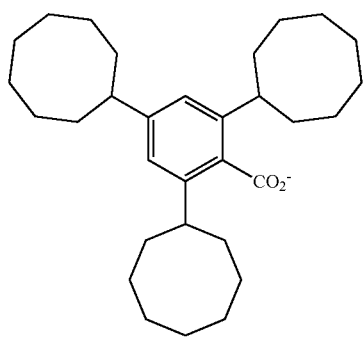
(A-42)
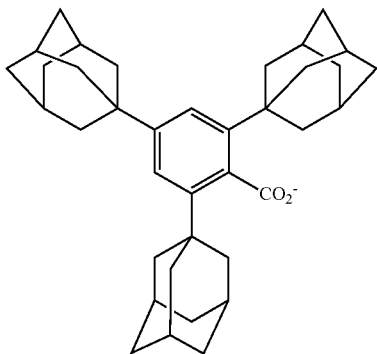
(A-39)
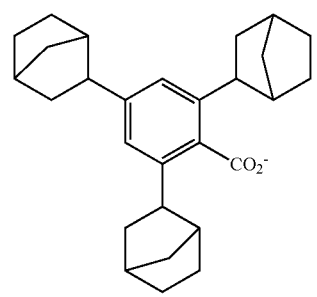
(A-43)
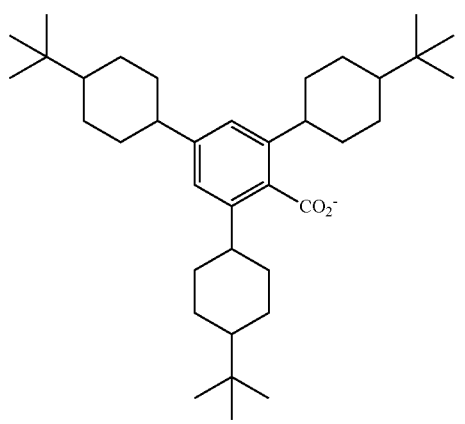
(A-40)
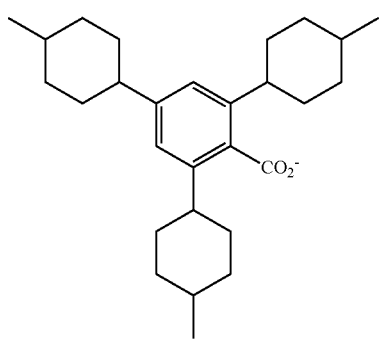
(A-44)
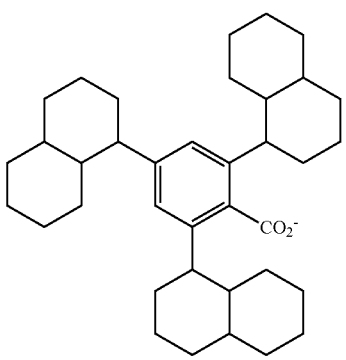
(A-41)
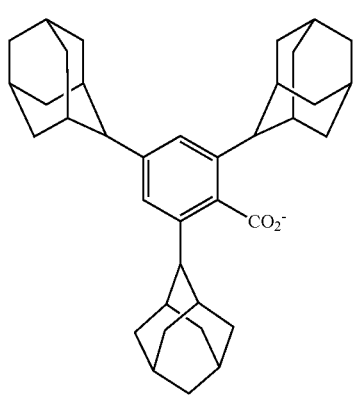
3. The resist composition of claim 1, further comprising an acid generator capable of generating at least one acid selected from sulfonic acids, imidic acids, and methide acids, upon exposure to high-energy radiation.
4. The resist composition of claim 1 wherein the polymer further comprises recurring units having the general formula (U-2):

(U-2)

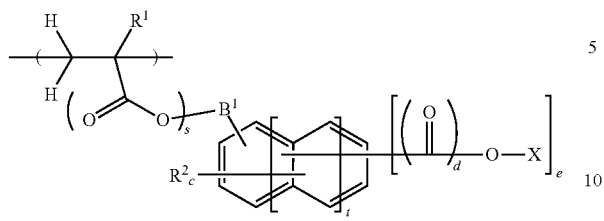

wherein s is 0 or 1, t is an integer of 0 to 2, $R^1$, $R^2$, and $B^1$ are as defined above, c is an integer satisfying c≤5+2t−e, d is 0 or 1, e is an integer of 1 to 3, X is an acid labile group when e is 1 or X is hydrogen or an acid labile group when e is 2 or 3, at least one X being an acid labile group.

5. The resist composition of claim 1 wherein the polymer further comprises recurring units having the general formula (U-3) and/or (U-4):

(U-3)

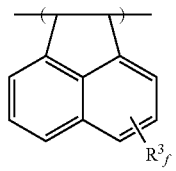

(U-4)

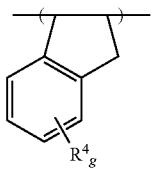

wherein f is an integer of 0 to 6, $R^3$ is each independently hydrogen, an optionally halo-substituted $C_1$-$C_6$ alkyl or primary or secondary alkoxy group, or an optionally halo-substituted $C_1$-$C_7$ alkylcarbonyloxy group, g is an integer of 0 to 4, and $R^4$ is each independently hydrogen, an optionally halo-substituted $C_1$-$C_6$ alkyl or primary or secondary alkoxy group, or an optionally halo-substituted $C_1$-$C_7$ alkylcarbonyloxy group.

6. The resist composition of claim 1, further comprising a basic compound.

7. The resist composition of claim 1 which is subject to ArF, KrF, EB, EUV or X-ray lithography.

8. A pattern forming process comprising the steps of applying the chemically amplified resist composition of claim 1 onto a processable substrate to form a resist film, exposing patternwise the resist film to high-energy radiation, and developing the exposed resist film in an alkaline developer to form a resist pattern.

9. The pattern forming process of claim 8 wherein the processable substrate has the outermost surface of a chromium-containing material.

10. The pattern forming process of claim 8 wherein the processable substrate is a photomask blank.

* * * * *